(12) United States Patent
K et al.

(10) Patent No.: US 12,206,424 B2
(45) Date of Patent: Jan. 21, 2025

(54) METHODS AND APPARATUS TO REDUCE INTER-STAGE GAIN ERRORS IN ANALOG-TO-DIGITAL CONVERTERS

(71) Applicant: Texas Instruments Incorporated, Dallas, TX (US)

(72) Inventors: Prasanth K, Bangalore (IN); Rahul Sharma, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 95 days.

(21) Appl. No.: 17/899,149

(22) Filed: Aug. 30, 2022

(65) Prior Publication Data

US 2024/0072817 A1   Feb. 29, 2024

(51) Int. Cl.
*H03M 1/06* (2006.01)
*H03M 1/10* (2006.01)
*H03M 1/16* (2006.01)

(52) U.S. Cl.
CPC ....... *H03M 1/0609* (2013.01); *H03M 1/1023* (2013.01); *H03M 1/1028* (2013.01); *H03M 1/1057* (2013.01); *H03M 1/164* (2013.01)

(58) Field of Classification Search
CPC ............. H03M 1/0609; H03M 1/1023; H03M 1/1028; H03M 1/1057; H03M 1/164
USPC .......................................... 341/156, 161–162
See application file for complete search history.

(56) References Cited

U.S. PATENT DOCUMENTS

| | | | |
|---|---|---|---|
| 6,486,820 B1 * | 11/2002 | Allworth | H03M 1/0604 341/161 |
| 9,705,520 B1 * | 7/2017 | Kumar | H03M 1/44 |
| 2012/0212358 A1 | 8/2012 | Shi et al. | |
| 2016/0013803 A1 | 1/2016 | Kuppambatti et al. | |
| 2022/0140836 A1 | 5/2022 | Huang et al. | |

FOREIGN PATENT DOCUMENTS

| | | |
|---|---|---|
| CN | 105024697 A | 11/2015 |
| CN | 112398474 A | 2/2021 |

OTHER PUBLICATIONS

International Search Report in corresponding PCT Application No. PCT/US2023/031548, mailed Dec. 7, 2023.
Machine Translation for CN105024697A.
Machine Translation for CN112398474A.

* cited by examiner

*Primary Examiner* — Khai M Nguyen
(74) *Attorney, Agent, or Firm* — Valerie M. Davis; Frank D. Cimino

(57) ABSTRACT

An example analog-to-digital converter (ADC) comprising: sample and hold circuitry coupled to an analog input; a first sub-ADC coupled to the sample and hold circuitry; a multiplying digital-to-analog converter (M-DAC) coupled to the first sub-ADC; summation circuitry coupled to the sample and hold circuitry and the M-DAC; an amplifier coupled to the summation circuitry; a second sub-ADC coupled to the amplifier; and reference generation circuitry coupled to the first sub-ADC, the M-DAC, and the second sub-ADC, the reference generation circuitry including: reference voltage circuitry coupled to the M-DAC; a first resistor coupled to the reference voltage circuitry; a second resistor coupled to the first resistor; and a capacitor coupled in parallel to the second resistor by a switch.

24 Claims, 10 Drawing Sheets

METHODS AND APPARATUS TO REDUCE INTER-STAGE GAIN ERRORS IN ANALOG-TO-DIGITAL CONVERTERS

TECHNICAL FIELD

This description relates generally to analog to digital conversions, and more particularly to methods and apparatus to reduce inter-stage gain errors in analog-to-digital converters.

BACKGROUND

Digital signal processing often use an analog-to-digital converter (ADC) to convert an analog input (e.g., an external analog signal) into a digital output. ADCs require time to perform such a conversion, which often limits digital signal processing. A pipeline ADC is capable of converting an analog input to a digital output at relatively high speeds with a relatively high precision. Typically, pipeline ADCs include a first-stage that determines at least one of the most significant bits (MSBs) of the digital output and a second-stage that determines the remaining bits of the digital output.

SUMMARY

For methods and apparatus to reduce inter-stage gain errors in analog to digital converters, an example analog-to-digital converter (ADC) comprising: sample and hold circuitry coupled to an analog input; a first sub-ADC coupled to the sample and hold circuitry; a multiplying digital to analog converter (M-DAC) coupled to the first sub-ADC; summation circuitry coupled to the sample and hold circuitry and the M-DAC; an amplifier coupled to the summation circuitry; a second sub-ADC coupled to the amplifier; and reference generation circuitry coupled to the first sub-ADC, the M-DAC, and the second sub-ADC, the reference generation circuitry including: a reference voltage coupled to the M-DAC; a first resistor coupled to the reference voltage; a second resistor coupled to the first resistor; and a capacitor coupled in parallel to the second resistor by a switch.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
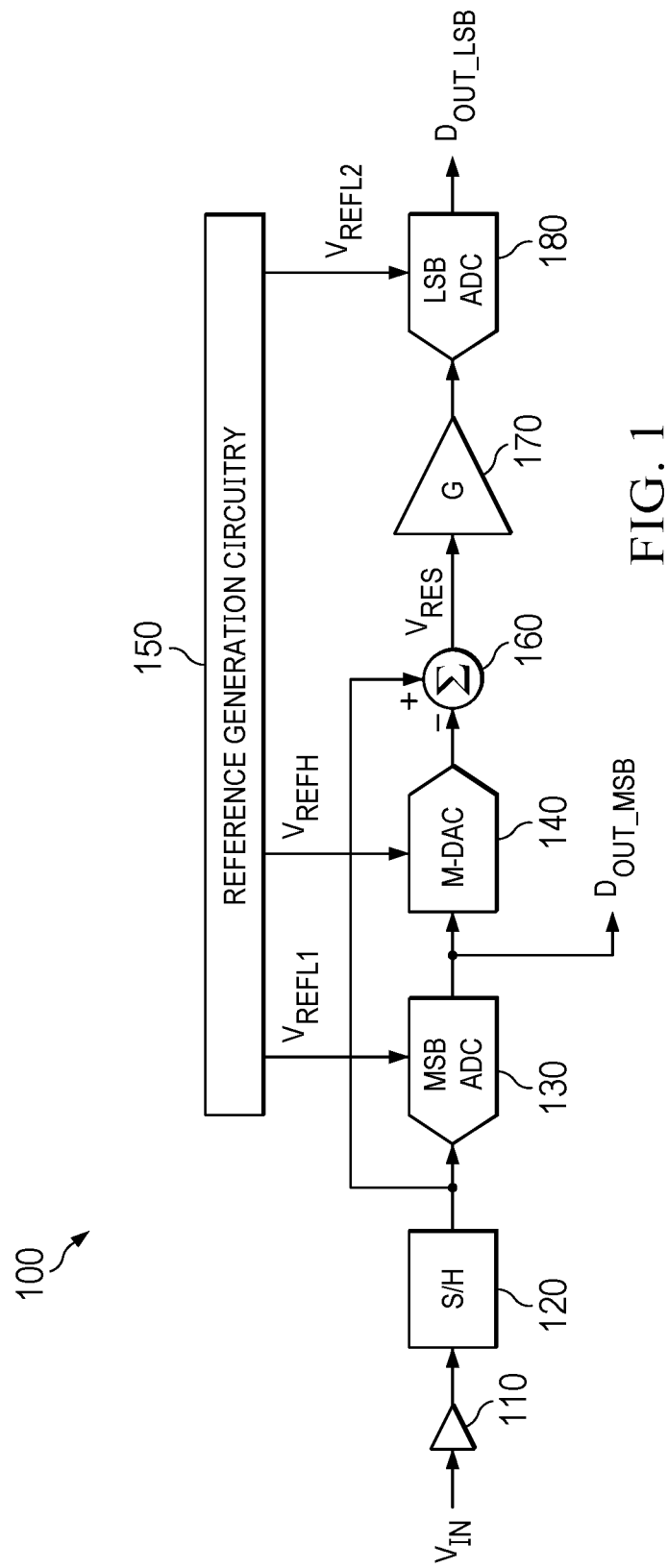
FIG. 1 is a block diagram of an example pipeline analog-to-digital converter including reference generation circuitry configured to generate a high voltage reference and a low voltage reference.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Digital signal processing may use an analog-to-digital converter (ADC) to convert analog input signals (such as signals from a sensor, signals received from a transmitter, etc.) into digital output signals. For example, a microcontroller may include an ADC to convert a voltage provided by a sensor to a digital value to allow the microcontroller to perform operations on the digital value using processor circuitry. ADCs require time to perform such a conversion, which often limits digital signal processing. As digital signal processing becomes increasingly advanced, some systems need ADCs capable of converting an analog input to a digital output at relatively high speeds and resolution.

A pipeline ADC converts an analog input signal to a digital output signal at relatively high speeds and resolution. Typically, pipeline ADCs include a first-stage that determines at least one of most significant bits (MSBs) of the digital output and a second-stage that determines the remaining bits of the digital output. The digital output of the pipeline ADC is a combination of the MSB(s) determined by the first-stage and the remaining bits determined by the second-stage.

The first-stage includes a first sub-ADC and a multiplying digital-to-analog converter (M-DAC). The first sub-ADC is an ADC of a relatively low resolution, such that a digital output of the sub-ADC generates fewer bits than a digital output of the pipeline ADC. The first sub-ADC determines at least one of most significant bits (MSBs) of the digital output of the pipeline ADC by comparing an input signal to a relatively large reference signal.

The first-stage removes voltages representative of the MSBs of the digital output from the analog input to reduce a voltage of an input to the second-stage of the pipeline ADC. The MSB of the digital output corresponds to approximately half of the potential voltage of the analog input. For example, a pipeline ADC capable of converting an analog input between plus/minus 48 volts sets the MSB equal to a logic one when the analog input is greater than or equal to approximately zero volts. In such an example, the digital output of the first sub-ADC sets the MSB equal to a logic zero (e.g., a logic "low" or 0) when the analog input is less than zero volts and sets the MSB equal to a logic one (e.g., a logic "high" or 1) when the analog input is greater than approximately zero volts. Additionally, the first sub-ADC may determine one or more additional bits of the digital output to further reduce the voltage of an input to the second-stage of the pipeline ADC.

The M-DAC generates an analog output based on the MSB(s) determined by the first sub-ADC. For example, a pipeline ADC capable of converting an analog input between plus/minus 48 volts causes the M-DAC to generate an analog output of 36 volts when the analog input is greater than 24 volts. In such an example, the first sub-ADC determines two MSBs of the digital output are logic ones, such that the MSB represents the analog input being greater than zero volts and the second MSB represents the analog input being greater than 24 volts.

The M-DAC converts the MSB(s) from the first sub-ADC into the analog output using a first reference input. The M-DAC needs the first reference input to be supplied by a reference voltage equal to a voltage being represented by the MSB(s) to ensure that the M-DAC is capable of generating an analog output equal to analog voltages represented by the MSB(s) of the pipeline ADC. For example, a first-stage of a pipeline ADC, which determines two MSBs of the digital output, needs a 48 volt reference voltage when the two MSBs of a digital output are logic ones and the analog output of the M-DAC is 36 volts. The pipeline ADC subtracts the analog output of the M-DAC from the analog input of the pipeline ADC to reduce the analog input by the analog output of the M-DAC. Advantageously, the pipeline ADC may use relatively lower voltage and higher speed circuitry in the second-stage as a result of the first-stage reducing the analog input.

The second-stage determines remaining bits of the digital output using the second sub-ADC. The second sub-ADC determines the remaining bits of the analog input using a second reference input coupled to a second reference voltage that is less than the first reference voltage of the first-stage. Advantageously, lower voltage circuitry included in the second-stage reduces a conversion time of a second sub-ADC and reduces power dissipated.

A mismatch of the reference voltages between the first-stage and the second-stage causes inter-stage gain error. Inter-stage gain error results from unaccounted for differences in reference voltages of the first-stage and the second-stage. Inter-stage gain error causes the digital output of the pipeline ADC to be inaccurate, such as one or more bits being incorrect. Inter-stage gain error decreases a signal-to-noise ratio (SNR) and increases the harmonic distortion of the digital output, similar to residue amplifier gain errors.

Some systems prevent inter-stage gain error by using the same reference input for the first-stage and the second-stage. In such an example, the second-stage is supplied the first reference voltage, which is capable of generating an analog value representative of the MSB(s) of the pipeline ADC which causes the second-stage to need to include circuitry capable of using the first reference voltage. Such relatively high voltage circuitry being supplied to the second-stage increases the duration needed to convert the analog input to a digital output and increases power dissipation. Another method of preventing inter-stage gain error is to use the reference voltage of the first-stage as a first reference voltage for the least significant bits of the second stage. In such a method, the second stage uses a second reference voltage, which is relatively lower than the first reference voltage, for the most significant bits. Such a method increases a speed of the second-stage and requires the second-stage to include circuitry capable of supporting the reference voltage of the first-stage and reduce inter-stage redundancies. Both methods of reducing inter-stage gain errors may route the reference input of the first-stage to the second-stage to reduce conversion speeds and increase a likelihood of coupling between components.

The examples described herein include a pipeline ADC including reference generation circuitry configured to reduce inter-stage gain error. In some described examples, the reference generation circuitry generates a relatively low voltage reference for a second-stage of a pipeline ADC using a relatively high voltage reference, which is supplied to a first-stage. The reference generation circuitry supplies both the high voltage reference and the low voltage reference to the first-stage and the low voltage reference to the second-stage. The reference generation circuitry generates the low voltage reference using a voltage divider across the high voltage reference, such that voltages sampled on the voltage divider are proportional to the high voltage reference. The reference generation circuitry samples the voltage divider using a first switch and a first capacitor. The first capacitor is configured to hold the sampled voltage while the first switch is open and the first capacitor is no longer coupled to the voltage divider. The reference generation circuitry samples the voltage being held across the first capacitor using a second switch and a second capacitor to generate a low voltage reference. A capacitance of the second capacitor is greater than the first capacitor to reduce noise on the low voltage reference. Advantageously, generating the low voltage reference using the reference generation circuitry reduces inter-stage gain error in the pipeline ADC in response to the low voltage reference being proportional to the high voltage reference.

FIG. 1 is a block diagram of an example pipeline ADC 100. In the example of FIG. 1, the pipeline ADC 100 includes a buffer 110, sample and hold circuitry 120, a first sub-ADC 130, an M-DAC 140, reference generation circuitry 150, summation circuitry 160, an amplifier 170, and a second sub-ADC 180. The pipeline ADC 100 converts an analog input ($V_{IN}$) to a digital output ($D_{OUT}$) (not shown) (e.g., M+K bits long). The digital output of the pipeline ADC 100 is a combination of at least one of the MSB(s) ($D_{OUT\_MSB}$) (e.g., M bits) from the first sub-ADC 130 and remaining bits ($D_{OUT\_LSB}$) (e.g., K bits) from the second sub-ADC 180. The pipeline ADC 100 includes the reference generation circuitry 150 to generate a first low voltage reference ($V_{REFL1}$) and a second low voltage reference ($V_{REFL2}$) proportional to a high voltage reference ($V_{REFH}$).

In the example of FIG. 1, the buffer 110 is coupled between the analog input ($V_{IN}$) and the sample and hold circuitry 120. The buffer 110 prevents circuitry comprising the pipeline ADC 100 from altering the analog input by isolating the circuitry configured to generate the analog input from the pipeline ADC 100. The buffer 110 supplies an isolated analog input to the sample and hold circuitry 120.

The sample and hold circuitry 120 is coupled to the buffer 110, the first sub-ADC 130, and the summation circuitry 160. The sample and hold circuitry 120 samples the isolated analog input from the buffer 110. The sample and hold circuitry 120 re-samples the isolated analog input from the buffer 110 after a duration of time. For example, the sample and hold circuitry 120 samples the isolated analog input from the buffer 110 approximately every one-hundred microseconds (µS). Alternatively, the sample and hold circuitry 120 may sample the isolated analog input in response to an event, such as an alert, enable signal, etc. The duration of time between samples may be determined based on a speed of an analog-to-digital conversion of the pipeline ADC 100. The sample and hold circuitry 120 holds the sampled analog input between samples. The sample and hold circuitry 120 supplies the sampled analog input to the first sub-ADC 130 and the summation circuitry 160.

The first sub-ADC 130 is coupled to the sample and hold circuitry 120, the M-DAC 140, the reference generation circuitry 150, and the summation circuitry 160. The first sub-ADC 130 determines at least one of the MSB(s) of the digital output of the pipeline ADC 100 based on the sampled analog input from the sample and hold circuitry 120 and the first low voltage reference ($V_{REFL1}$) from the reference generation circuitry 150. The first sub-ADC 130 determines the MSB(s) (e.g., M bits where M is greater than or equal to one) of the digital output by determining whether the sampled analog input is greater than or equal to approximately half of a voltage range of the pipeline ADC 100. The voltage range of the pipeline ADC 100 comprises of all voltages which may be represented using the digital output of the pipeline ADC 100. For example, a voltage range equal to twice the high voltage reference corresponds to the digital output of the pipeline ADC 100 being capable of representing between plus/minus the high voltage reference. In such an example, the first low voltage reference may be approximately half of the high voltage reference (approximately one-fourth of the voltage range) to determine two MSBs of the digital output between plus/minus half of the high reference voltage. The MSB of the digital output of the pipeline ADC 100 may represent a sign of the digital output. For example, where the analog input has a voltage range between +X volts and −X volts, the first sub-ADC 130 determines the MSB of the digital output of the pipeline ADC 100 is a logic one when the sampled analog input is greater than or equal to zero volts and the digital output of the pipeline ADC 100 may represent analog inputs between plus/minus the high voltage reference. The first sub-ADC 130 may scale the analog input by a gain less than one to reduce the low voltage reference. For example, the first sub-ADC 130 scales the analog input by one half to represent voltages equal to twice the low voltage reference. In such an example, the first low voltage reference may be one-quarter of the high voltage reference to represent voltages between plus/minus half of the high voltage reference, such as the two MSBs of the digital output.

The first sub-ADC 130 may determine a plurality of the MSBs of the digital output. For example, the first sub-ADC 130 determines three MSBs (e.g., M=3) of the digital output of the pipeline ADC 100 are equal to logic ones when the sampled analog input is greater than or equal to three fourths of the high voltage reference. In such an example, a first MSB represents the sampled analog input being greater than common potential (e.g., ground or zero volts), a second MSB represents the sampled analog input being greater than one half the high voltage reference, and a third MSB represents the sampled analog input being greater than three fourths the high voltage reference. The first sub-ADC 130 supplies the MSB(s) ($D_{OUT\_MSB}$) of the digital output to the M-DAC 140. Advantageously, the first low voltage reference enables the first sub-ADC 130 to include lower voltage and higher speed circuitry.

The M-DAC 140 is coupled to the first sub-ADC 130, the reference generation circuitry 150, and the summation circuitry 160. The M-DAC 140 generates an analog output based on the MSB(s) of the digital output from the first sub-ADC 130 and the high voltage reference ($V_{REFH}$) from the reference generation circuitry 150. For example, the analog output of the M-DAC 140 is equal to one half of the high voltage reference when two MSBs of the output of the first-sub ADC 130 are both logic ones. In such an example, the MSB being a logic one represents the sampled analog input being greater than common potential (e.g., ground) and the second MSB being a logic one represents the sampled analog input being greater than one half of the high voltage reference. The analog output of the M-DAC 140 is an analog representation of the MSB(s) of the digital output from the first sub-ADC 130. For example, the analog output of the M-DAC 140 is approximately equal to a common potential (e.g., ground) when the MSB of the digital output from the first sub-ADC 130 is a logic one and any remaining bits of the output of the first sub-ADC 130 are zero. In such an example, the first sub-ADC 130, at a minimum (e.g., where M=1), determines that the sampled analog input is greater than common potential, such that any future ADC operation needs a reference voltage of approximately half of the high voltage reference. The M-DAC 140 needs the high voltage reference to be greater than or equal to half the difference between a highest and lowest voltages which may be represented by the MSB(s) of the digital output. For example, the high voltage reference needs to be at least twenty-four volts when the two MSBs of a digital output are a logic one (corresponds to twenty-four volts). In such an example, the voltage range of the pipeline ADC 100 is plus/minus forty-eight volts such that the MSB of the digital output corresponds to greater than common potential and the second MSB corresponds to greater than or equal to half of the difference between common potential and half the voltage range. The M-DAC 140 supplies the analog output to the summation circuitry 160.

The reference generation circuitry 150 is coupled to the first sub-ADC 130, the M-DAC 140, and the second sub-ADC 180. The reference generation circuitry 150 generates the first and second low voltage references ($V_{REFL1}$ and $V_{REFL2}$, respectively) proportional to the high voltage reference ($V_{REFH}$). Such a generation of the low voltage reference reduces inter-stage gain errors between the M-DAC 140 and the second sub-ADC 180. The reference generation circuitry 150 is discussed further in connection with FIG. 2, below. The reference generation circuitry 150 supplies the first low voltage reference to a first reference input of the first sub-ADC 130. The reference generation circuitry 150 supplies the high voltage reference to a second reference input of the M-DAC 140. The reference generation circuitry 150 supplies the second low voltage reference to a third reference input of the second sub-ADC 180.

The summation circuitry 160 is coupled to the sample and hold circuitry 120, the M-DAC 140, and the amplifier 170. The summation circuitry 160 generates a subtracted analog output by subtracting the analog output of the M-DAC 140 from the sampled analog input of the sample and hold circuitry 120. For example, the subtracted analog output is four volts when the sampled analog input is twenty-eight volts and analog output of the M-DAC 140 is twenty-four volts (e.g., M=2 and the MSBs are 11). The summation circuitry 160 supplies the subtracted analog output to the amplifier 170. The subtracted analog output may be referred to as a residue. Advantageously, the summation circuitry 160 reduces the sampled analog input to enable the amplifier 170 and the second sub-ADC 180 to include relatively lower voltage circuitry, which is capable of relatively higher speeds of operation, compared to the circuitry used by the M-DAC 140.

The amplifier 170 is coupled to the summation circuitry 160 and the second sub-ADC 180. The amplifier 170 amplifies the subtracted analog output from the summation circuitry 160 by a designed gain (G). The amplifier 170 reduces noise supplied by the second sub-ADC 180 by amplifying the subtracted analog output. For example, noise, resulting from the second sub-ADC 180, ranging from plus one millivolt (mV) to minus one millivolt (mV) impacts a ten millivolt (mV) signal substantially more than if the signal were amplified to ten volts (V).

Advantageously, the amplifier 170 reduces noise resulting from the second sub-ADC 180.

The amplifier 170 may amplify the subtracted analog output to increase a number of bits which may be determined by the second sub-ADC 180, when of a fixed resolution. For example, the number of bits determined by a sub-ADC that is capable of ten millivolts (mV) precision may be increased to a precision of one millivolt (mV) by amplifying the subtracted analog input by a designed gain of ten. In such an example, bits determined by the second sub-ADC 180 may be scaled to be consistent with the MSB(s) determined by the first sub-ADC 130. Advantageously, the precision of the second sub-ADC 180 may be increased as a result of the amplifier 170 amplifying the subtracted analog input. The amplifier 170 supplies the amplified subtracted analog input to the second sub-ADC 180.

The second sub-ADC 180 is coupled to the reference generation circuitry 150 and the amplifier 170. The second sub-ADC 180 determines a plurality of bits of the digital output of the pipeline ADC 100 based on the second low voltage reference from the reference generation circuitry 150 and the amplified subtracted analog input from the amplifier 170. The M-DAC 140 and the summation circuitry 160 reduce a voltage range of the second sub-ADC 180 by greater than or equal to half of the voltage range of the analog input. For example, the circuitry comprising the second sub-ADC 180 need to be capable of a voltage range between plus minus twenty-five percent the voltage range of the analog input when the first sub-ADC 130 determines the two MSBs of the digital output. Advantageously, circuitry comprising the second sub-ADC 180 may be relatively lower voltage circuitry, which is capable of increased speeds, compared to the circuitry comprising the first sub-ADC 130 and the M-DAC 140.

In example operation of the pipeline ADC 100, the sample and hold circuitry 120 samples the isolated analog input and provides the sampled analog input to the first sub-ADC 130 and the summation circuitry 160 for a hold time. Such a hold time may be referred to as a hold phase. The first sub-ADC 130 determines the MSB(s) of the digital output of the pipeline ADC 100 using the first low voltage reference. The first sub-ADC 130 supplies the determined MSB(s) to the M-DAC 140. The M-DAC 140 converts the MSB(s) into an analog output using the high voltage reference. As discussed in more detail below, the M-DAC 140 includes circuitry (not illustrated) which causes voltage swings in the high voltage reference. For example, charge injection from switches, internal to the M-DAC 140, may cause the high voltage reference to swing above and/or below an average voltage being supplied. The voltage swings cause unaccounted for gain errors that may not be trimmed using one time trim. The voltage swings on the high voltage reference prevent the reference generation circuitry 150 from generating the low voltage references using a voltage divider. Such voltage swings in the high voltage reference are illustrated and discussed in further detail in connection with FIGS. 7 and 8, below. The voltage swings on the high voltage reference settle over time. However, the voltage swings cause the average voltage supplied to the M-DAC 140 to vary.

The reference generation circuitry 150 reduces inter-stage gain errors resulting from such variations in the high voltage reference by proportionally matching variations in the average voltage of the high voltage reference in the low voltage references. The reference generation circuitry 150 generates the low voltage references using the high voltage reference, such that the low voltage references are proportional to the high voltage reference. The reference generation circuitry 150 samples the low voltage references from the high voltage reference near the end of the hold phase, such that any voltage swings have begun to settle. At the end of the hold phase, the low voltage reference is proportional to the high voltage reference as a result of the voltage swings settling. Such a method of sampling the high voltage reference near the end of the hold phase reduces reference errors, which may not be trimmed using a one-time trim due to variations in the voltage swings across process, voltage, and temperature (PVT). Alternatively, the voltage swings on the low voltage references may be mitigated using a large capacitor, which would substantially increase a system-on-chip (SoC) size. The reference generation circuitry 150 is discussed in further detail in connection with FIG. 2, below.

The summation circuitry 160 subtracts the analog output of the M-DAC 140 from the sampled analog input. The summation circuitry 160 supplies a subtracted analog output to the amplifier 170. The amplifier 170 amplifies the subtracted analog output to reduce noise contributions from the second sub-ADC 180. The second sub-ADC 180 converts the amplified subtracted analog output to generate a plurality of LSBs of the digital output using the second low voltage reference. Advantageously, the reference generation circuitry 150 reduces inter-stage gain errors caused by not accounted for differences between the high voltage reference and the low voltage references.

Figure 2:
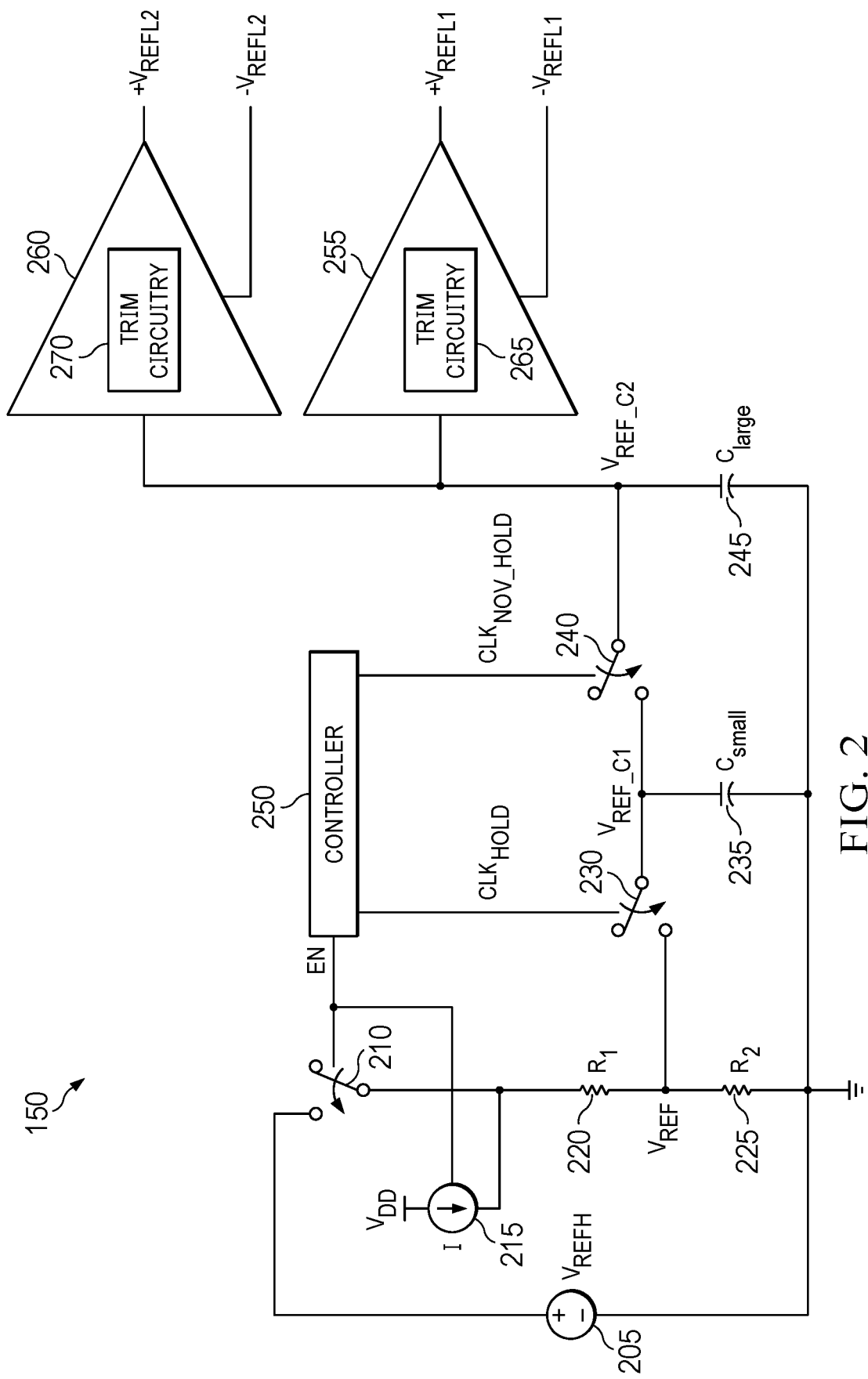
FIG. 2 is a schematic diagram of the reference generation circuitry of FIG. 1 configured to generate the low voltage reference using the high voltage reference.

FIG. 2 is a schematic diagram of the reference generation circuitry 150 of FIG. 1. In the example of FIG. 2, the reference generation circuitry 150 includes a high voltage reference source 205, a first switch 210, a current source 215, a first resistor 220, a second resistor 225, a second switch 230, a first capacitor 235, a third switch 240, a second capacitor 245, a controller 250, a first reference amplifier 255, and a second reference amplifier 260. The reference generation circuitry 150 generates a first low voltage reference ($V_{REFL1}$) and a second low voltage reference ($V_{REFL2}$) based on a high voltage reference ($V_{REFH}$) generated by the high voltage reference source 205.

In the example of FIG. 2, the high voltage reference source 205 is coupled to the first switch 210 and common potential (e.g., ground). Alternatively, the high voltage reference source 205 may be coupled to the first resistor 220. In such an example, the first switch 210 and the current source 215 may be removed from the reference generation circuitry 150. The high voltage reference source 205 generates the high voltage reference. The high voltage reference source 205 may be referred to as reference voltage circuitry or reference voltage generation circuitry, which is circuitry capable of supplying a reference voltage. The high voltage reference source 205 may include high voltage reference amplifier circuitry (not illustrated) configured to generate a coarse high voltage reference and a fine high voltage reference. In such a configuration, the high voltage reference source 205 may switch between supplying the coarse high voltage reference and the fine high voltage reference as the high voltage reference. For example, at a first time, the high voltage reference source 205 supplies the coarse high voltage reference to the M-DAC 140 of FIG. 1 and at a second time the high voltage reference source 205 supplies the fine high voltage reference to the M-DAC 140. In such an example, voltage swings caused by the M-DAC 140 impact the coarse high voltage reference, while the fine high voltage reference is used by the reference generation circuitry 150 to generate the low voltage references with reduced voltage swings. Advantageously, such switching by the high voltage reference source 205 between a course high voltage reference and a fine high voltage reference reduces input dependent settling issues on the fine high voltage reference caused by circuitry coupled to the course high voltage reference (such as the M-DAC 140).

The first switch 210 is coupled to the high voltage reference source 205, the current source 215, the first resistor 220, and the controller 250. The first switch 210 couples the high voltage reference source 205 to the first resistor 220 based on the controller 250. The first switch 210 may be opened or closed by the controller 250. For example, the controller 250 may close the first switch 210 to couple the high voltage reference source 205 to the first resistor 220 or open the first switch 210 to prevent the high voltage reference source 205 from applying the high voltage reference across to the first resistor 220. The first switch 210 may be a transistor configured to be turned on (e.g., conducting) and turned off (e.g., not conducting) by the controller 250. Advantageously, the first switch 210 increases reliability of the high voltage reference and low voltage reference in response to the controller 250 being able to disable the low voltage reference by disabling the first switch 210. The first switch 210 may be coupled to the M-DAC 140 to enable the reference generation circuitry 150 to disable both the high voltage reference and the low voltage reference by disabling (turning off so that it is non-conducting) the first switch 210. For example, the first switch 210 may be coupled to the M-DAC 140 so that when the first switch 210 is opened, the M-DAC 140 is disconnected from the high voltage reference source 205.

The current source 215 is coupled to the first switch 210, the first resistor 220, and the controller 250. The current source 215 supplies a compensation current (I) to the first resistor 220. The compensation current corrects for voltage differences across the first switch 210 by supplying enough current to make a voltage difference across a combined resistance of the resistors 220 and 225 ($R_1+R_2$) equal to the high voltage reference ($V_{REFH}$) of the high voltage reference source 205. The current supplied by the current source 215 is determined using Equation (1), below. The current source 215 may be enabled (e.g., supply current) or disabled (e.g., not supplying current) by the controller 250. Advantageously, the current source 215 reduces variations in the voltage across the resistors 220 and 225 from the high voltage reference source 205, which are caused by an internal resistance (not illustrated) of the first switch 210.

$$I = \frac{V_{REFH}}{R_1 + R_2} \quad \text{Equation (1)}$$

The first resistor 220 is coupled to the switches 210 and 230, the current source 215, and the second resistor 225. The first resistor 220 is coupled between the first switch 210 and the second resistor 225. The first resistor 220 has a first resistance ($R_1$). The second resistor 225 is coupled to the first resistor 220, the second switch 230, and common potential (e.g., ground). The second resistor 225 is coupled between the first resistor 220 and common potential. The second resistor 225 has a second resistance ($R_2$). The resistors 220 and 225 are configured as a voltage divider. The resistors 220 and 225 may be referred to as reference voltage circuitry, which is circuitry configured to supply a reference voltage. Alternatively, the resistors 220 and 225 may be replaced with another method of generating a voltage based on the high voltage reference in accordance with the teaching disclosed herein. The resistors 220 and 225 may be located relatively close to the M-DAC 140 to reduce errors caused by electrical traces, such as parasitic inductance, resistance, etc. For example, a system-on-chip (SoC) implementation of the pipeline ADC 100 may place the resistors 220 and 225 based on a location of the M-DAC 140.

The resistances of the resistors 220 and 225 are selected to generate the reference voltage ($V_{REF}$) at anode between resistors 220 and 225 and used to determine the compensation current in Equation (1), above. The reference voltage is approximately equal to the second resistance times the high voltage reference divided by an addition of the first resistance plus the second resistance. The reference voltage may be determined using Equation (2), below. Advantageously, the reference voltage is generated using the high voltage reference and voltage division.

$$V_{REF} = R_2 \frac{V_{REFH}}{R_1 + R_2} \quad \text{Equation (2)}$$

The second switch 230 is coupled to the resistors 220 and 225, the first capacitor 235, the third switch 240, and the controller 250. The second switch 230 couples the reference voltage generated by the resistors 220 and 225 across the first capacitor 235 based on the controller 250. The second switch 230 may be opened (e.g., non-conducting) or closed (e.g., conducting) by the controller 250. The controller 250 may be configured to open and close the second switch 230 at a sampling frequency ($F_S$). The sampling frequency corresponds to a time between the controller 250 opening the second switch 230. The sampling frequency may be determined based on the duration determined for the sample and hold circuitry 120 of FIG. 1, such as between sampling and re-sampling. The second switch 230 is configured to set a voltage across the first capacitor 235 to be approximately (preferably exactly) equal to the reference voltage. Such voltage across the first capacitor 235 may be referred to as a small capacitor reference ($V_{REF\_C1}$).

The first capacitor 235 is coupled to the switches 230 and 240 and common potential. The small capacitor reference of the first capacitor 235 is approximately equal to the reference voltage generated between the resistors 220 and 225 when the second switch 230 couples the first capacitor 235 to the resistors 220 and 225. The first capacitor 235 has a first capacitance ($C_{small}$).

The third switch 240 is coupled to the second switch 230, the capacitors 235 and 245, the controller 250, and the reference amplifiers 255 and 260. The third switch 240 may be opened or closed by the controller 250. The third switch 240 sets a voltage across the second capacitor 245 equal to the voltage across the first capacitor 235 based on the controller 250. For example, the voltage across the second capacitor 245 is approximately equal to the small capacitor reference following the controller closing the third switch 240. Such voltage across the second capacitor 245 may be referred to as a large capacitor reference ($V_{REF\_C2}$). The second capacitor 245 is coupled to the third switch 240, the reference amplifiers 255 and 260 and common potential. The large capacitor reference is approximately equal to the small capacitor reference following the third switch 240 coupling the first capacitor 235 to the second capacitor 245. The second capacitor 245 has a second capacitance ($C_{large}$) that is greater than the first capacitance of the first capacitor 235 to reduce noise. For example, the second capacitance may be large enough to average noise of the small capacitor reference. Advantageously, the second capacitor 245 reduces errors which result from noise, and such a relatively large capacitance of the second capacitor 245 reduces coupling to relatively small parasitic capacitances (not illustrated) of inputs to the reference amplifiers 255 and 260. The capacitances of the capacitors 235 and 245 modify an effective bandwidth and a sampling bandwidth of the reference generation circuitry 150, as illustrated below. The sampling bandwidth corresponds to generating the small capacitor reference of the first capacitor 235 by the high voltage reference of the high voltage reference source 205. The effective bandwidth corresponds to generating the large capacitor reference of the second capacitor 245 by the high voltage reference of the high voltage reference source 205.

The effective bandwidth ($BANDWIDTH_{eff}$) of the reference generation circuitry 150 may be determined using Equation (3), below. The sampling bandwidth ($BANDWIDTH_{Samp}$) of the reference generation circuitry 150 is configured to be greater than a bandwidth of the amplifier 170 to enable a voltage across the first capacitor 235 to track the voltage generated by the high voltage reference source 205. The sampling bandwidth of the reference generation circuitry 150 is determined using equation (4), below. Advantageously, the difference between bandwidths of the reference generation circuitry 150 and the amplifier 170 reduce errors between the voltage across the first capacitor 235 and the resistors 220 and 225.

$$\text{Bandwidth}_{eff} \approx \frac{1}{\left(2*\pi*(R_1\|R_2) + \frac{1}{F_s*C_{small}}\right)*C_{large}} \quad \text{Equation (3)}$$

$$\text{Bandwidth}_{Samp} \approx \frac{1}{(2*\pi*(R_1\|R_2))*C_{small}} \quad \text{Equation (4)}$$

The controller 250 is coupled to the switches 210, 230, and 240 and the current source 215. The controller 250 enables the reference generation circuitry 150 by closing the first switch 210 and enabling the current source 215. The controller 250 controls the second switch 230 using a clock hold signal ($CLK_{HOLD}$). The controller 250 controls the third switch 240 using a non-overlapping clock hold signal ($CLK_{NOV\_HOLD}$). The clock hold signal and the non-overlapping clock hold signal are discussed further below in connection with FIG. 7. The controller 250 may include dedicated reference sources configured to enable and disable the switches 210, 230, and 240. The controller 250 closes the second switch 230 to couple the first capacitor 235 to the reference voltage generated by the resistors 220 and 225. The controller 250 ensures that the third switch 240 is open during the time that the second switch 230 is closed. The controller 250 opens the second switch 230 to hold the small capacitor reference approximately equal to the reference voltage. The controller 250 closes the third switch 240 to couple the second capacitor 245 to the first capacitor 235. The controller 250 ensures the second switch 230 remains open while the third switch 240 couples the capacitors 235 and 245. The controller 250 opens the third switch 240 to hold the large capacitor reference approximately equal to the small capacitor reference.

The reference amplifiers 255 and 260 are coupled to the third switch 240 and the second capacitor 245. The first reference amplifier 255 generates the first low voltage reference based on the voltage across the second capacitor 245. The first reference amplifier 255 includes first trim circuitry 265. The first trim circuitry 265 modifies the first reference amplifier 255 to compensate for variations in temperature and direct current (DC) offset of the voltage across the second capacitor 245 and the first reference amplifier 255. The first trim circuitry 265 is discussed below in connection with FIGS. 4-6. Advantageously, the first trim circuitry 265 reduces errors by reducing variations in the first low voltage reference caused by temperature variations and/or DC offset.

The second reference amplifier 260 generates the second low voltage reference based on the voltage across the second capacitor 245. The first and second low voltage references are approximately equal to the large capacitor reference. The second reference amplifier 260 includes second trim circuitry 270. The second trim circuitry 270 modifies the second reference amplifier 260 to compensate for variations in temperature and DC offset of the voltage across the second capacitor 245 and the second reference amplifier 260. The second trim circuitry 270 is similar to the first trim circuitry 265. Advantageously, the second trim circuitry 270 reduces inter-stage gain error by reducing variations in the first low voltage reference caused by temperature variations and/or DC offset.

Figure 3:
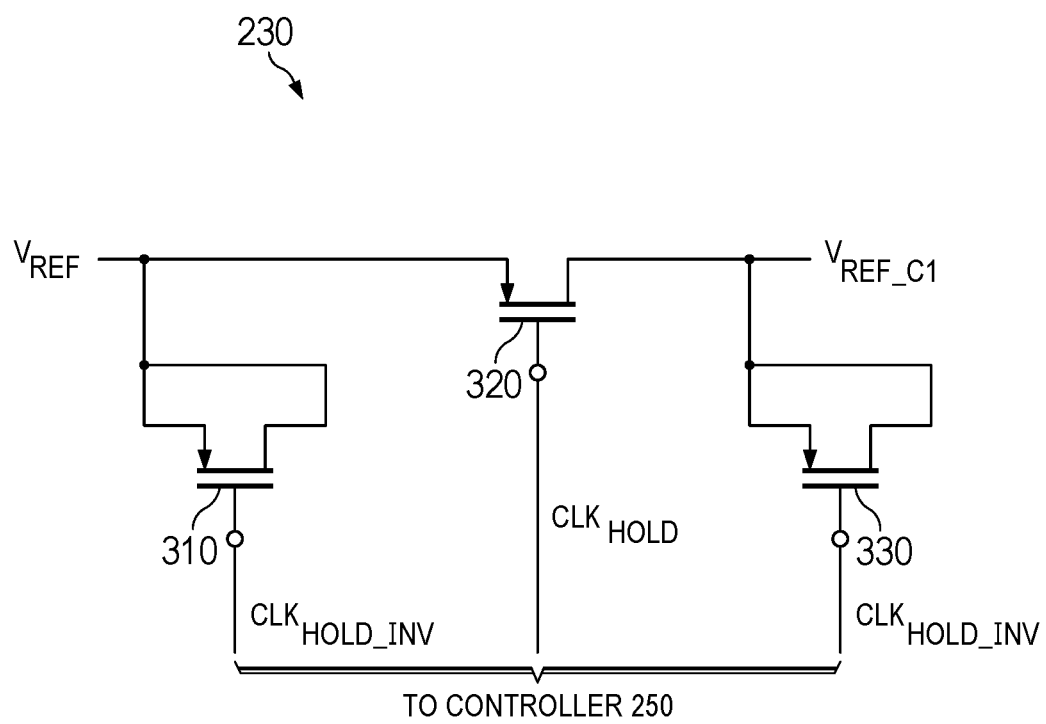
FIG. 3 is a schematic diagram of a switch configured to use charge injection cancellation to reduce charge injection caused by switching of the reference generation circuitry of FIGS. 1 and 2.

FIG. 3 is a schematic diagram of the second switch 230 of FIG. 2 configured to use charge injection cancellation to reduce charge injection caused by switching of the reference generation circuitry 150 of FIGS. 1 and 2. Such charge injection may cause errors which may not be corrected by one time trim. In the example of FIG. 3, the second switch 230 includes a first transistor 310, a second transistor 320, and a third transistor 330. The transistors 310-330 are p-channel transistors. Alternatively, with slight modifications to the second switch 230, the transistors may be n-channel transistors. The transistors 310-330 are configured to be turned on (e.g., conducting) or turned off (e.g., non-conducting) by the controller 250 of FIG. 2. The second switch 230 is referred to as closed when the transistors 310 and 330 are turned off and the second transistor 320 is turned on. The second switch 230 is referred to as open when the transistors 310 and 330 are turned on and the second transistor 320 is turned off.

The control terminal (e.g., gate) of first transistor 310 is coupled to the controller 250 (e.g., to receive control signal $CLK_{NOV\_HOLD}$) and the current terminals (e.g., the source and/or drain) of the first transistor 310 are coupled to one of the current terminals of the second transistor 320. The first transistor 310 is controlled by the controller 250. The first transistor 310 is configured to be turned on while the second transistor 320 is turned off. The first transistor 310 stores current supplied by the second transistor 320 following the second transistor 320 being turned off. Such a current supplied by the second transistor 320 may be due to an internal capacitance (not illustrated) of the second transistor 320 discharging. The first transistor 310 supplies the stored current, when turned off, to charge the internal capacitance of the second transistor 320. The operations of collecting and storing such a current may be referred to as charge injection cancelation. Advantageously, the first transistor 310 implements a method of charge cancelation to prevent changes to the reference voltage and in turn the high voltage reference which result from a current supplied by turning on and off the second transistor 320.

The control terminal of second transistor 320 is coupled to the controller 250 (e.g., to receive control signal $CLK_{HOLD}$) and one of the current terminals is connected to current terminals of transistor 310 and the other current terminal is connected to the current terminals of transistor 330. The second transistor 320 is controlled by the controller 250. The controller 250 is configured to turn on the second transistor 320 at approximately (preferably exactly) the same time as the transistors 310 and 330 are turned off. The controller 250 is configured to turn off the second transistor 320 at approximately (preferably exactly) the same time as the transistors 310 and 330 are turned on. For example, the controller 250 supplies a clock hold signal ($CLK_{HOLD}$) to control the second transistor 320 and an inverted version of the clock hold signal ($CLK_{HOLD\_INV}$) to control the transistors 310 and 330. The second transistor 320 includes internal capacitances (not illustrated) which charge when the second transistor 320 is turned on and discharge when the second transistor 320 is turned off. Such a discharge of the internal capacitors cause current to be supplied to the transistors 310 and 330. Such current is referred to as charge injection. Charge injection caused by the second transistor 320 may be reduced by decreasing a size of the second transistor 320 to reduce the internal capacitances. The transistors 310 and 330 are configured to store current released by the second transistor 320 when turned off and supply the collected current to the second transistor 320 when turned on. Advantageously, an impact of charge injection caused by turning off the second transistor 320 on the reference generation circuitry 150 is reduced by the transistors 310 and 330.

The control terminal of the third transistor 330 is coupled to the controller 250 and the current terminals of third transistor 330 is coupled to one of the current terminals of second transistor 320. The third transistor 330 is controlled by the controller 250. The third transistor 330 is configured to be turned on while the second transistor 320 is turned off. The third transistor 330 stores current supplied by turning off the second transistor 320. The third transistor 330 supplies the stored current, when turned off, to charge internal capacitances of the second transistor 320. Advantageously, the third transistor 330 implements a method of charge cancelation to prevent changes to the small capacitor reference in response to a current supplied by turning on and off the second transistor 320.

As illustrated in FIG. 2, transistors 310, 320 and 330 may be implemented using metal-oxide semiconductor field effect transistors (MOSFET). Preferably, each of transistors 310, 320 and 330 are implemented using p-channel MOSFETs (pMOSFETs). Alternatively, the transistors 310, 320 and/or 330 may be PNP bipolar junction transistors (BJT), N-channel field-effect transistors (FET), N-channel insulated-gate bipolar transistors (IGBT), N-channel junction field effect transistors (JFET), N-channel MOSFETs, P-channel FETs, P-channel IGBTs, P-channel JFETs, or NPN BJTs. The clock hold signals, which control the transistors 310-330, turn on the transistors 310-320 using a common potential (AVSS) and turn off the transistors 310-320 using a clean supply voltage (AVDD). The clean supply voltage is a voltage supply that is isolated from switching components capable of adding noise to the clock hold signals. For example, the clean supply voltage may be a voltage generated by a dedicated voltage source. Advantageously, clean supply voltages reduce clock coupling of the hold signals, which may not be trimmed.

In the example of FIG. 3, the second switch 230 is illustrated. Alternatively, the use of transistors 310-330 to implement charge injection cancellation may be applied in accordance with the teachings described herein as circuitry comprising the switches 210 and/or 240 of FIG. 2 to reduce charge injection caused by switching. In some examples, the channel width of transistors 310 and 330 are a fraction (e.g., around half) of the channel width of transistor 320.

Figure 4:
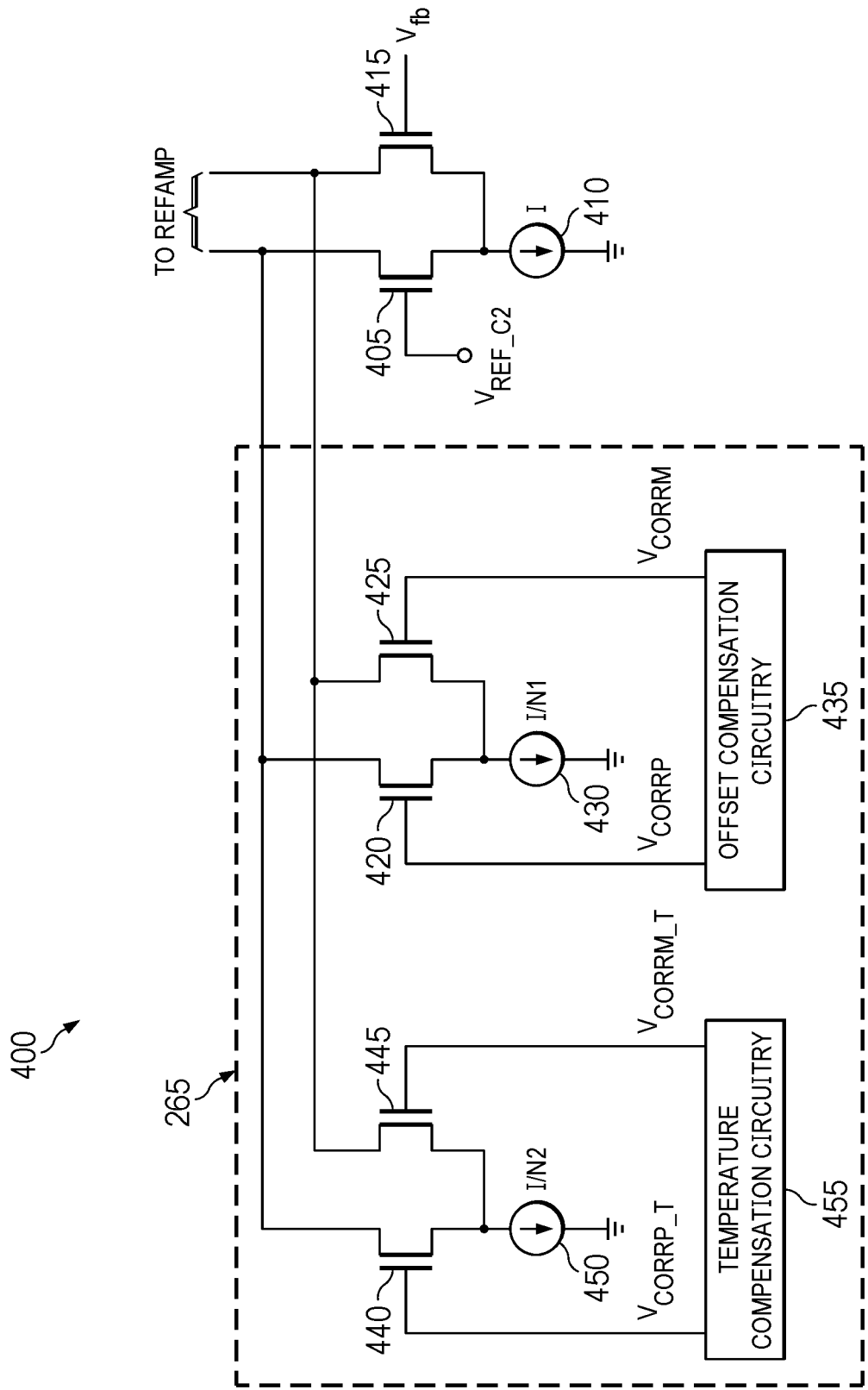
FIG. 4 is a schematic diagram of an example input stage of a reference amplifier including offset compensation circuitry and temperature compensation circuitry, the input stage configured to trim the low voltage reference generated by the reference generation circuitry of FIGS. 1 and 2.

FIG. 4 is a schematic diagram of an example input stage 400 of the first reference amplifier 255 of FIG. 2. The input stage 400 including the first trim circuitry 265 of FIG. 2, configured to trim the large capacitor reference ($V_{REF\_C2}$) generated by the reference generation circuitry 150 of FIGS. 1 and 2. In the example of FIG. 4, the input stage 400 includes the first trim circuitry 265, a first transistor 405, a first current source 410, and a second transistor 415. The input stage 400 is configured to reduce gain error caused by DC offset and/or temperature variations by compensating the large capacitor reference.

In the example of FIG. 4, the first trim circuitry 265 includes a third transistor 420, a fourth transistor 425, a second current source 430, offset compensation circuitry 435, a fifth transistor 440, a sixth transistor 445, a third current source 450, and temperature compensation circuitry 455. The first trim circuitry 265 is configured to trim the large capacitor reference to compensate for DC offset and/or temperature variations.

The third transistor 420 is coupled to the transistors 405, 425, and 440, the second current source 430, and the offset compensation circuitry 435. A first offset correction voltage ($V_{CORRP}$) is supplied by offset circuitry 435 to the control terminal of third transistor 420 and controls the third transistor 420. The offset compensation circuitry 435 generates the first offset correction voltage based on a determined DC offset. The determined DC offset may be a voltage determined as a part of a calibration of the offset compensation circuitry 435 and/or determined using an analog-to-digital conversion of the large capacitor reference and the first low voltage reference ($V_{REFL1}$). The determined DC offset is described in further detail below. The third transistor 420 allows current to flow to the second current source 430 when turned on by the first offset correction voltage. The third transistor 420 prevents current from flowing to the second current source 430 when turned off.

The fourth transistor 425 is coupled to the transistors 415, 420, and 445, the second current source 430, and the offset compensation circuitry 435. A second offset correction voltage ($V_{CORRM}$) is supplied by offset circuitry 435 to the control terminal of fourth transistor 425 and controls the fourth transistor 425. The offset compensation circuitry 435 generates the second offset correction voltage based on the determined DC offset. The determined DC offset is a difference between the first offset correction voltage and the second offset correction voltage. The fourth transistor 425 allows current to flow to the second current source 430 when turned on by the second offset correction voltage. The fourth transistor 425 prevents current from flowing to the second current source 430 when turned off.

The second current source 430 supplies current from the transistors 420 and/or 425 to the output of the input stage 400 of the reference amplifier 255. A magnitude of the second current source 430 may be divided by a first scalar value (N1) to reduce noise added by the transistors 420 and 425 and provide additional control over the DC offset. For example, a ten milli-volt (mV) DC offset may be corrected by applying a one-hundred milli-volt (mV) difference between the first offset correction voltage and the second offset correction voltage when a first scalar value of the second current source 430 is equal to ten. The magnitude of the second current source 430 is approximately (preferably exactly) equal to the magnitude of the first current source 410 when the first scalar value is equal to one. Advantageously, a magnitude of noise supplied by the offset correction voltages is divided by the first scalar value.

The offset compensation circuitry 435 generates the offset correction voltages which are supplied to the transistors 420 and 425. The potential difference between the offset correction voltages is configured to offset the large capacitor reference by a DC voltage, similar to adding the DC voltage directly to the large capacitor reference. A magnitude of the DC offset may be calibrated or determined. For example, an ADC (and/or other circuitry operable to provide such functionality) may be coupled to the large capacitor reference and the low voltage reference to determine a DC voltage contribution and configure the offset compensation circuitry 435 to generate a corresponding DC voltage. In such an example, the ADC may configure the second offset correction voltage to three millivolts (mV) to compensate the large capacitor reference for having a three millivolt (mV) offset. An example of the offset compensation circuitry 435 is described in further detail in connection with FIG. 5, below.

The fifth transistor 440 is coupled to the transistors 405, 420, and 425, the third current source 450, and the temperature compensation circuitry 455. A first temperature correction voltage ($V_{CORRP\_T}$) is supplied by offset circuitry 455 to the control terminal of fifth transistor 440 and controls the fifth transistor 440. The temperature compensation circuitry 455 generates the first temperature correction voltage based on temperature dependent circuitry. The temperature compensation circuitry 455 is described in further detail below and in connection with FIG. 6. The fifth transistor 440 allows current to flow to the third current source 450 when turned on by the first temperature correction voltage. The fifth transistor 440 prevents current from flowing to the third current source 450 when turned off.

The sixth transistor 445 is coupled to the transistors 415, 425, and 440, the third current source 450, and the temperature compensation circuitry 455. A second temperature correction voltage ($V_{CORRM\_T}$) is supplied by offset circuitry 455 to the control terminal of sixth transistor 445 and controls the sixth transistor 445. The temperature compensation circuitry 455 generates the second temperature correction voltage based on temperature dependent circuitry of the compensation circuitry 455. The temperature compensation circuitry 455 is described in further detail below and in connection with FIG. 6. The sixth transistor 445 allows current to flow to the third current source 450 when turned on by the second temperature correction voltage. The sixth transistor 445 prevents current from flowing to the third current source 450 when turned off.

The third current source 450 supplies current from the transistors 440 and/or 445 to the common potential. A magnitude of the third current source 450 may be divided by a second scalar value (N2) to reduce noise added by the transistors 440 and 445 and provide additional control over the temperature variation of the DC offset value. For example, a ten millivolt (mV) temperature variation may be corrected with approximately a one-hundred millivolt (mV) temperature dependent variation in difference between the first temperature correction voltage and the second temperature correction voltage when the second scalar value of the third current source 450 is equal to ten. The magnitude of the third current source 450 is approximately (preferably exactly) equal to the magnitude of the first current source 410 when the second scalar value is equal to one. Advantageously, a magnitude of noise supplied by the temperature correction voltages is divided by the second scalar value.

The temperature compensation circuitry 455 generates the temperature correction voltages being supplied to the control terminals of transistors 440 and 445. The potential difference between the temperature correction voltages is configured to offset the large capacitor reference by a voltage representative of variations in the circuitry of the reference generation circuitry 150 and the first reference amplifier 255 across temperatures. A magnitude of the temperature compensation is determined using temperature compensation circuitry 455. An example of the temperature compensation circuitry 455 is described in further detail in connection with FIG. 6, below.

In the example of FIG. 4, the first transistor 405 is coupled to the first current source 410 and the transistors 415, 420, and 440. The first transistor 405 is controlled by the large capacitor reference generated across the second capacitor 245 of FIG. 2. The first transistor 405 allows current to flow to the first current source 410 when turned on by the second capacitor voltage. The first transistor 405 prevents current from flowing to the first current source 410 when turned off.

The first current source 410 is coupled to the transistors 405 and 415. The first current source 410 is configured to supply current from the transistors 405 and/or 415 to the output of the input stage 400 of the reference amplifier 255.

The second transistor 415 is coupled to the transistors 405, 425, and 445. The second transistor 415 is controlled by a feedback input. The feedback input may be coupled to an output of the first reference amplifier 255. The second transistor 415 allows current to flow to the first current source 410 when turned on by the feedback input. The second transistor 415 prevents current from flowing to the first current source 410 when turned off.

In the example of FIG. 4, the first trim circuitry 265 is illustrated. Alternatively, the input stage 400 including circuitry to compensate for DC offset and/or temperature variation may be applied in accordance with the teachings described herein as circuitry comprising the second trim circuitry 270 of FIG. 2 to reduce gain error caused by DC offset and/or temperature variations.

Figure 5:
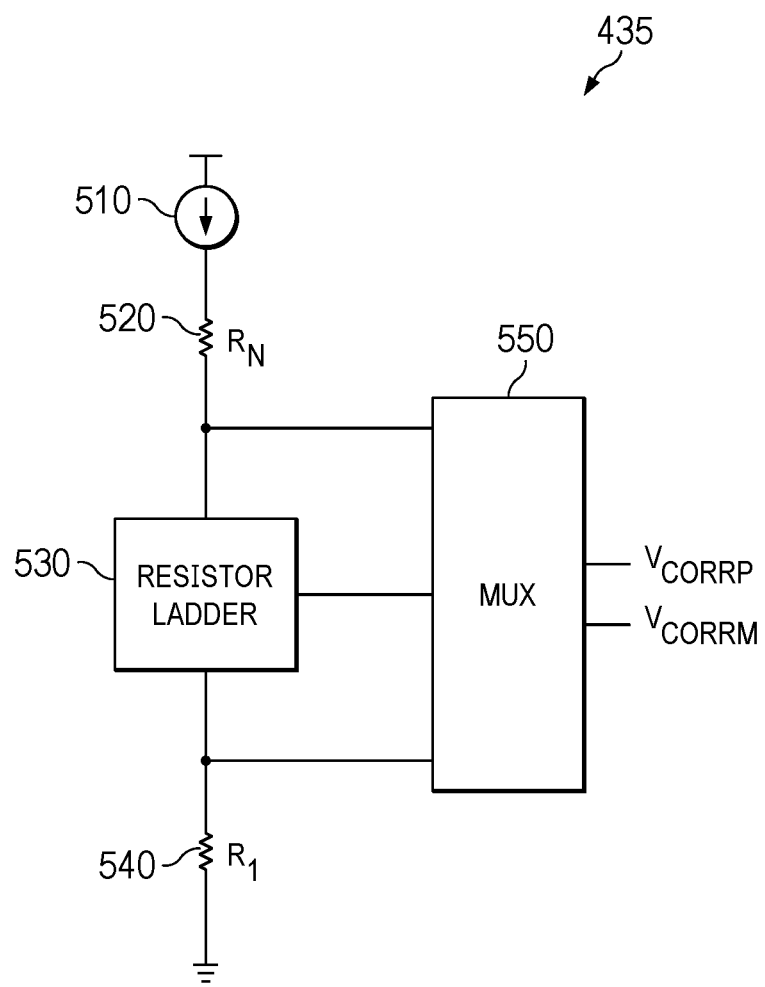
FIG. 5 is a schematic diagram of the offset compensation circuitry of FIG. 4 configured to generate an offset voltage to compensate the low voltage reference generated by the reference generation circuitry of FIGS. 1 and 2 for a direct current (DC) offset.

FIG. 5 is a schematic diagram of an example implementation for offset compensation circuitry 435 of FIG. 4, configured to generate an offset voltage to compensate the low voltage reference generated by the reference generation circuitry 150 of FIGS. 1 and 2 for a DC offset. In the example of FIG. 5, the offset compensation circuitry 435 includes a current source 510, a first resistor 520, an example resistor ladder 530, a second resistor 540, and an example multiplexer 550. The offset compensation circuitry 435 generates the offset correction voltages ($V_{CORRP}$ and/or $V_{CORRM}$) using the multiplexer 550 to select a voltage generated by the current source 510 and the resistor ladder 530.

In the example of FIG. 5, the current source 510 is coupled to the first resistor 520 and supplies a current to the first resistor 520. A magnitude of current supplied by the current source 510 may be determined to generate a potential drop across the first resistor 520, the resistor ladder 530, and/or the second resistor 540.

The first resistor 520 is coupled to the current source 510, the resistor ladder 530, and the multiplexer 550. The resistor ladder 530 is coupled to the resistors 520 and 540 and the multiplexer 550. The resistor ladder 530 is a resistor circuit configured to divide a potential difference into a plurality of voltage divisions. For example, the resistor ladder 530 may be implemented by a plurality of coupled resistors. Examples of resistor ladders include resistor ladders shown in co-assigned U.S. Pat. Nos. 8,618,971, 5,969,658, 4,467, 286 (each of which are incorporated by reference in their entirety). The second resistor 540 is coupled to the resistor ladder 530 and the multiplexer 550.

The multiplexer 550 couples a voltage generated by the resistor ladder 530 to the first offset correction voltage and/or the second offset voltage. Advantageously, the multiplexer 550 may be configured to couple a voltage corresponding to a determined DC offset to the offset correction voltages. The multiplexer 550 may be controlled by an ADC (not illustrated) or by the controller 250 of FIG. 2. For example, the multiplexer 550 may be configured to be controlled by a digital value resulting from an analog-to-digital conversion of the large capacitor reference. In such an example, the multiplexer 550 may include circuitry to convert the digital value to configure the offset correction voltages. Alternatively, the controller 250 may control the multiplexer 550 to correct for a DC offset determined as a part of a calibration process. For example, a manufacturer may calibrate the controller 250 and/or the multiplexer 550 to generate the offset correction voltages to a calibrated value.

Figure 6:
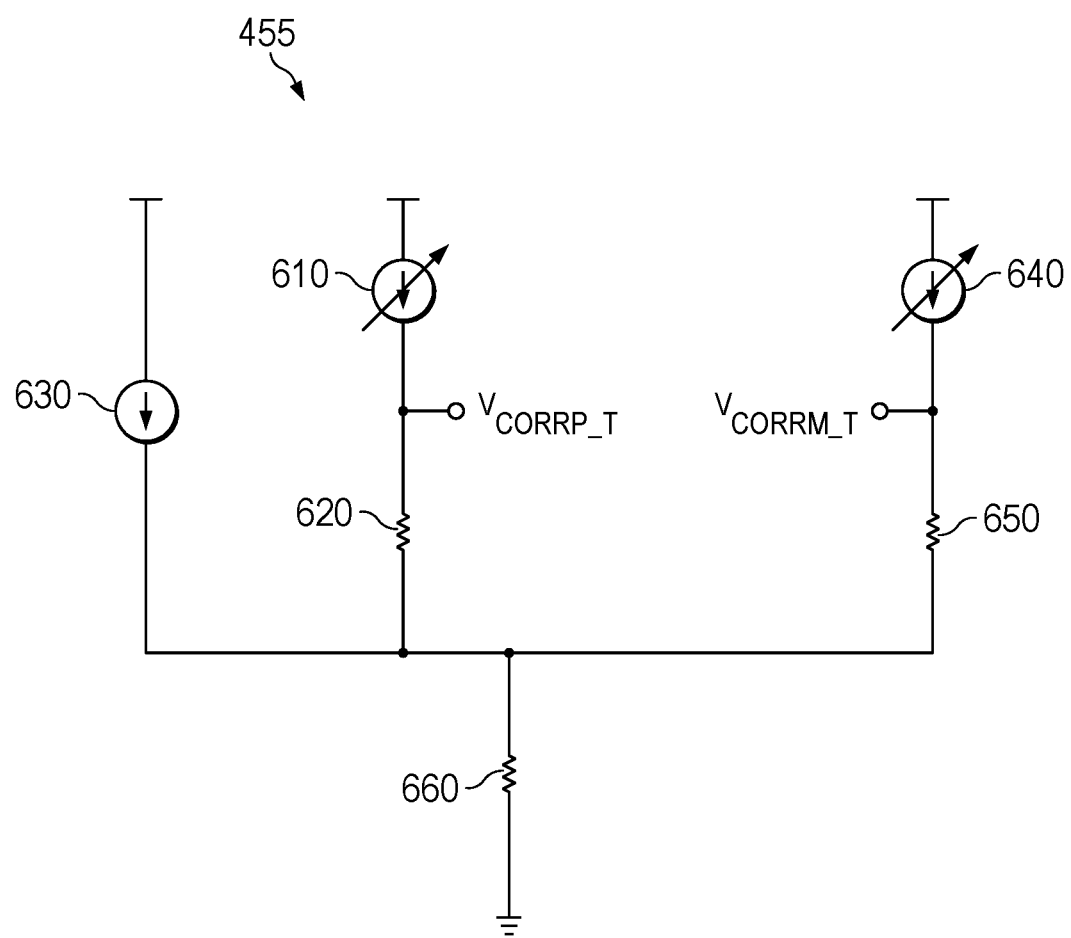
FIG. 6 is a schematic diagram of the temperature compensation circuitry of FIG. 4 configured to generate temperature compensation voltages to compensate the low voltage reference generated by the reference generation circuitry of FIGS. 1 and 2 for variations in temperature.

FIG. 6 is a schematic diagram of an example implementation of the temperature compensation circuitry 455 of FIG. 4, configured to generate temperature compensation voltages to compensate the low voltage reference generated by the reference generation circuitry 150 of FIGS. 1 and 2 and the first reference amplifier 255 for variations in temperature. In the example of FIG. 6, the temperature compensation circuitry 455 includes a first variable current source 610, a first resistor 620, a fixed current source 630, a second variable current source 640, a second resistor 650, and a third resistor 660. The temperature compensation circuitry 455 generates the first temperature compensation voltage ($V_{CORRP\_T}$) and the second temperature compensation voltage ($V_{CORRM\_T}$) using variable current sources 610 and 640 configured to supply a current based on the temperature.

In the example of FIG. 6, the first variable current source 610 is coupled to the first resistor 620. The first variable current source 610 supplies a current to the first resistor 620 to generate the first temperature correction voltage. A magnitude of the current supplied by the first variable current source 610 varies with temperature to compensate for temperature variations. The first variable current source 610 may be a current digital-to-analog converter (IDAC) configured to supply a current based on a digital input. In such an example, a temperature sensor may be used to determine the digital input.

The first resistor 620 is coupled to the first variable current source 610, the fixed current source 630, and the resistors 650 and 660. The first resistor 620 generates a potential difference to set the first temperature correction voltage based on current supplied by the first variable current source 610 and the third resistor 660.

The fixed current source 630 is coupled to the resistors 620, 650, and 660. The fixed current source 630 supplies a current to the third resistor 660 to generate a fixed potential difference. A magnitude of the current being supplied by the fixed current source 630 is determined to set the voltage difference across the third resistor 660.

The second variable current source 640 is coupled to the second resistor 650. The second variable current source 640 supplies a current to the second resistor 650 to generate the second temperature correction voltage. A magnitude of the current being supplied by the second variable current source 640 varies with temperature to compensate for temperature variations. The second variable current source 640 may be a IDAC configured to supply a current based on a digital input. In such an example, a temperature sensor may be used to determine the digital input.

The second resistor 650 is coupled to the fixed current source 630, the second variable current source 640, and the resistors 620 and 660. The first resistor 620 generates a potential difference to set the first temperature correction voltage based on current supplied by the first variable current source 610 and the third resistor 660. The third resistor 660 is coupled to the resistors 620 and 650 and the fixed current source 630. The third resistor 660 is configured to generate a voltage difference to offset both of the temperature correction voltage equally.

Figure 7:
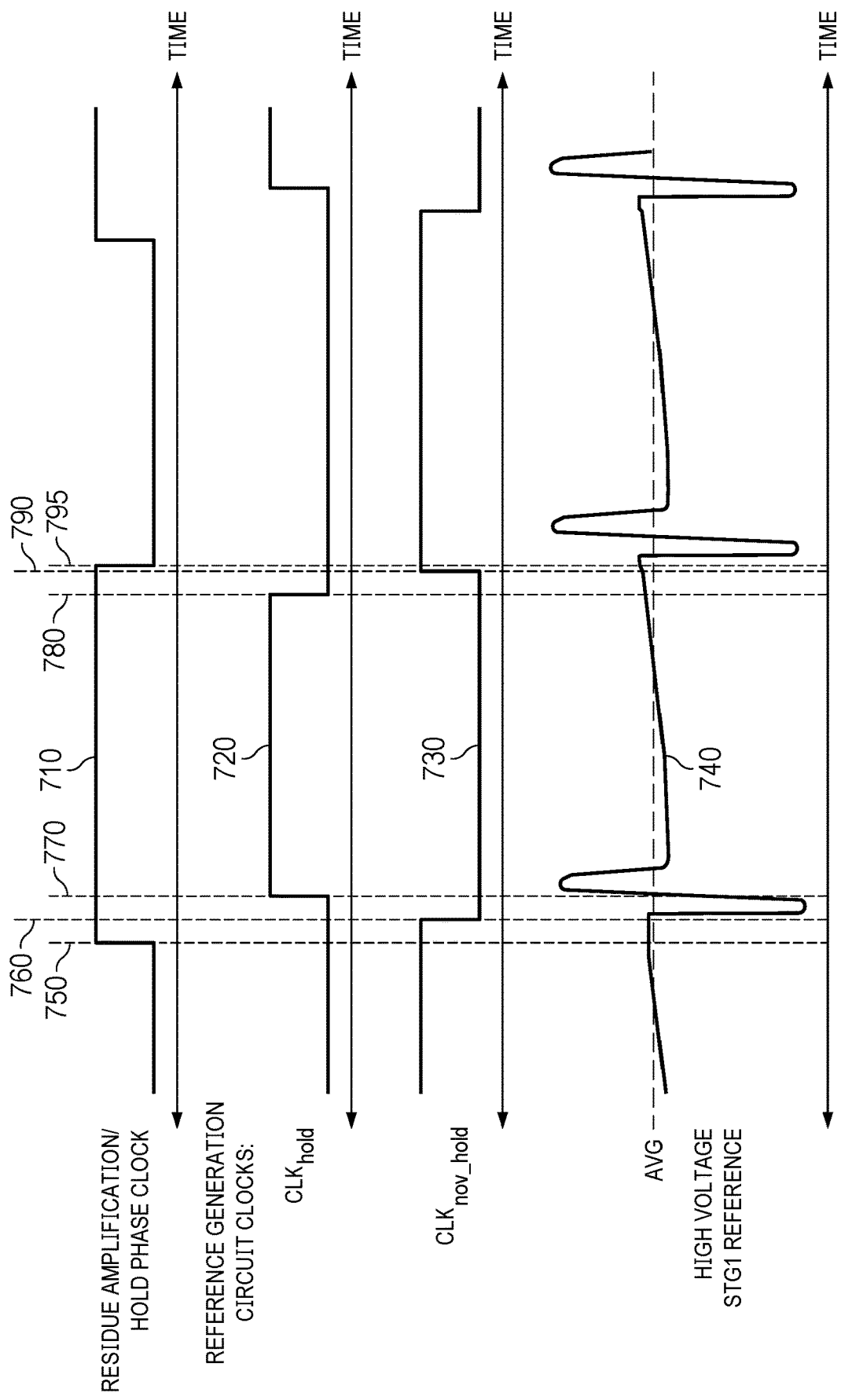
FIG. 7 is a timing diagram of an example switching operation of the reference generation circuitry of FIGS. 1 and 2 to generate the low voltage reference.

FIG. 7 is a timing diagram of an example switching operation of the reference generation circuitry 150 of FIGS. 1 and 2 to generate the low voltage reference. In the example of FIG. 7, the timing diagram illustrates a residue amplification/hold phase clock 710, a clock hold signal ($CLK_{HOLD}$) 720, a non-overlapping clock hold signal ($CLK_{NOV\_HOLD}$) 730, and a high voltage reference signal 740.

The residue amplification/hold phase clock 710 represents a signal configured to control operations of the amplifier 170 of FIG. 1. For example, the amplifier 170 amplifies the difference between the sampled analog input from the sample and hold circuitry 120 of FIG. 1 and the analog output of the M-DAC 140 of FIG. 1 on a rising edge of the residue amplification/hold phase clock 710. In such an example, the second-sub ADC 180 of FIG. 1 samples the output of the amplifier 170 at a falling edge of the residue amplification/hold phase clock 710. The residue amplification/hold phase clock 710 may be generated by the controller 250 or internal to the amplifier 170.

The clock hold signal 720 represents a signal generated by the controller 250 of FIG. 2 to control the second switch 230 of FIGS. 3 and 4. The clock hold signal 720 represents the second switch 230 being closed as a logical high, such as to turn on the second transistor 320 of FIG. 3 and turn off the transistors 310 and 330 of FIG. 3. The clock hold signal 720 represents the second switch 230 being open as a logical low, such as to turn off the second transistor 320 and turn on the transistors 310 and 330. Although in the example of FIG. 7, a logic high of the clock hold signal 720 corresponds to the second switch 230 being closed, transistors comprising the second switch 230 may be turned on using a common potential (e.g., ground, AVSS, etc.) (e.g., a logical low or "0").

The non-overlapping clock hold signal 730 represents a signal generated by the controller 250 to control the third switch 240 of FIG. 3. The non-overlapping clock hold signal 730 represents the third switch 240 being closed as a logical high, such as to turn on the second transistor 320 and turn off the transistors 310 and 330. The non-overlapping clock hold signal 730 represents the third switch 240 being open as a logical low, such as to turn off the second transistor 320 and turn on the transistors 310 and 330. Although in the example of FIG. 7, a logic high of the non-overlapping clock hold signal 730 corresponds to the third switch 240 being closed, transistors comprising the third switch 240 may be turned on using a common potential (e.g., ground, AVSS, etc.).

The high voltage reference signal 740 represents the high voltage reference (e.g., $V_{REFH}$) generated by the reference generation circuitry 150. The high voltage reference signal 740 is supplied to the M-DAC 140. The high voltage reference signal 740 settles to a voltage above an average (AVG) of the high voltage reference signal 740. The reference generation circuitry 150 reduces inter-stage gain error of the pipeline ADC 100 of FIG. 1 by generating the low voltage references to be proportional to the high voltage reference at the end of the hold phase (e.g., when $CLK_{HOLD}$ transitions from a logic high to a logic low—time 780). The reference generation circuitry 150 reduces gain error by using the high voltage reference signal 740 to generate the low voltage reference. The high voltage reference signal 740 may vary as a result of switching internal to the M-DAC 140 causing variations in the high voltage reference source 205 of FIG. 2. However, variations in the high voltage reference signal 740 are minimized as switching ends and/or the high voltage reference source 205 settles.

At a first time 750, the residue amplification/hold phase clock 710 transitions from a logical low to a logical high representing the residue amplification/hold phase. For example, the sample and hold circuitry 120 of FIG. 1 re-samples the analog input and holds the sampled analog input until the following rising edge. The amplifier 170 amplifies the subtracted analog output from the first time 750 until a following falling edge of the residue amplification/hold phase clock 710. At the first time 750, the high voltage reference signal 740 changes as switching internal to the M-DAC 140 adds noise and/or needs additional current from the high voltage reference source 205. Such impacts from switching reduce as time passes in response to components of the M-DAC 140 and the reference generation circuitry 150 settling.

At a second time 760, the non-overlapping clock hold signal 730 transitions from a logical high to a logical low representing the controller 250 opening the third switch 240 to de-couple the capacitors 235 and 245 of FIG. 2. At the second time 760, the large capacitor reference is approximately equal to the low voltage reference. At the second time 760, the controller 250 ensures that the non-overlapping clock hold signal 730 is not a logic high at the same time as the clock hold signal 720. For example, the falling edge of the non-overlapping clock hold signal 730 at the second time 760 may be generated to prepare for a rising edge of the clock hold signal 720. A rising edge of the non-overlapping clock hold signal 730 is configured to be delayed until following a falling edge of the clock hold signal 720.

At a third time 770, the clock hold signal 720 transitions from a logical low to a logical high representing the controller 250 closing the second switch 230 thereby coupling the first capacitor 235 of FIG. 2 to the reference voltage generated across the second resistor 225 of FIG. 2. At the third time 770, the high voltage reference signal 740 begins to settle, and the large capacitor reference remains approximately equal to the low voltage reference.

At a fourth time 780, the clock hold signal 720 transitions from a logical high to a logical low representing the controller 250 opening the second switch 230. At the fourth time 780, the small capacitor reference is held by the first capacitor 235, and the small capacitor reference is a noisy version of reference voltage generated by the resistors 220 and 225. The noise on the small capacitor reference is in response to the capacitance of the first capacitor 235 being small enough to allow relatively high frequency changes to remain.

At a fifth time 790, the non-overlapping clock hold signal 730 transitions from a logical low to a logical high representing the controller 250 closing the third switch 240, thereby coupling the capacitors 235 and 245 in parallel. The large capacitor reference is set to filter relatively higher frequency noise of the small capacitor reference in response to the capacitance of the second capacitor 245 being greater than the capacitance of the first capacitor 235. The noise filtered by the second capacitor 245 may be determined based on the effective bandwidth of the reference generation circuitry 150. The effective bandwidth of the reference generation circuitry 150 may be determined using Equation (3), above.

At a sixth time 795, the residue amplification/hold phase clock 710 transitions from a logic high to a logic low, thereby causing the amplifier 170 to stop amplifying the subtracted analog output as the sample and hold circuitry 120 re-samples the analog input. The time between the fourth time 780 and the sixth time 795 is relatively small to ensure the voltage across the first capacitor 235 is approximately equal to the reference voltage when the high voltage reference signal 740 has settled. Advantageously, opening the second switch 230 near the end of the hold phase at time 795 reduces inter-stage gain error by ensuring the voltage across the first capacitor 235 is proportional to the high voltage reference after settling. Advantageously, noise on the small capacitor reference is averaged by the second capacitor 245. Advantageously, gain error resulting from noise is reduced by the second capacitor 245.

Figure 8:
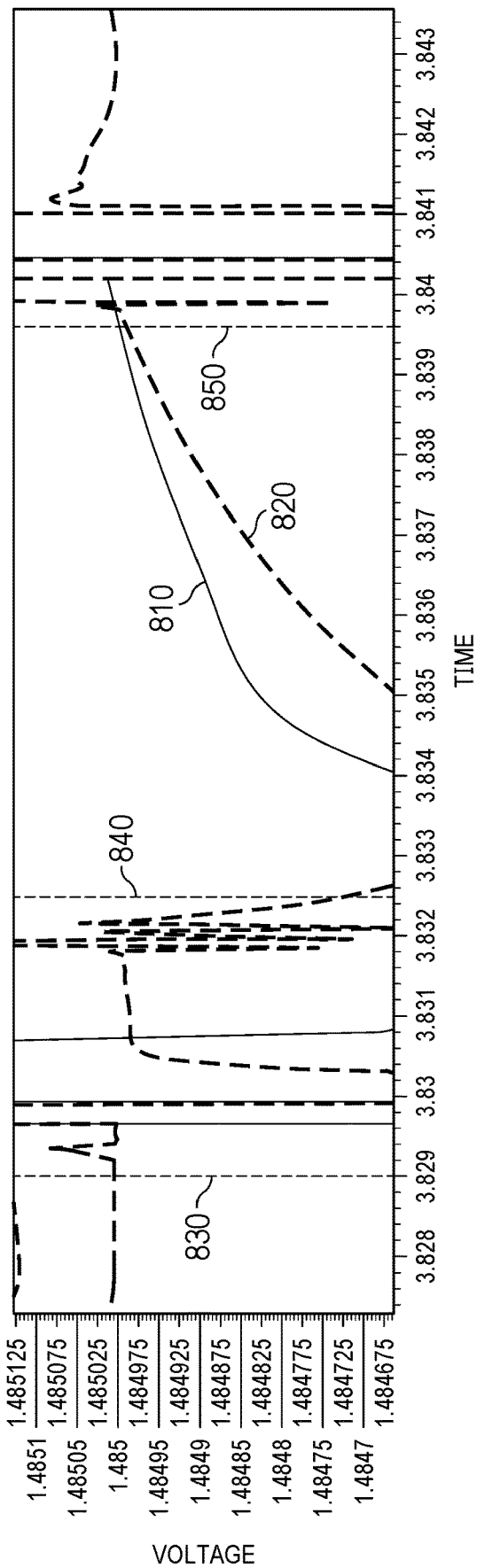
FIG. 8 is a timing diagram of an example operation of the reference generation circuitry of FIGS. 1 and 2 including the low voltage reference and the high voltage reference, the low voltage reference generated using the switching operation of FIG. 7.

FIG. 8 is a timing diagram of an example operation of the reference generation circuitry 150 of FIGS. 1 and 2 including the low voltage reference and the high voltage reference generated using the switching operation of FIG. 7. In the example of FIG. 8, the timing diagram includes an example scaled high voltage reference signal 810 and an example low voltage reference signal 820.

In the example of FIG. 8, the scaled high voltage reference signal 810 is a scaled version of the high voltage reference supplied to the M-DAC 140 of FIG. 1. The scaled high voltage reference signal 810 is scaled to be approximately equal to the low voltage reference. For example, the scaled high voltage reference signal 810 may be scaled by one-half when the resistance of the resistors 220 and 225 of FIG. 2 are equal. A low voltage reference signal 820 is the low voltage reference generated by the reference generation circuitry 150. In the example operation of FIG. 8, the inter-stage gain error between the first-stage and second-stage of the pipeline ADC 100 of FIG. 1 is zero if the reference signals 810 and 820 are equal at a time that the second sub-ADC 180 of FIG. 1 samples the output of the amplifier 170. The inter-stage gain error between the first-stage and the second-stage is determined by determining the difference between the scaled high voltage reference, represented by the scaled high voltage reference signal 810, and the low voltage reference, represented by the low voltage reference signal 820 at the end of residue amplification/hold phase clock 710.

A first time 830 corresponds to approximately the first time 750 of FIG. 7. At a second time 840, the low voltage reference signal 820 follows the scaled high voltage reference signal 810. At a third time 850, the residue amplification/hold phase clock 710 of FIG. 7 transitions to a logic low. The third time 850 is approximately equal to the fourth time 780 of FIG. 7. The inter-stage gain error of the pipeline ADC 100 contributes to a portion of the difference between the reference signals 810 and 820 at the third time 850. In the example of FIG. 8, an error between the reference signals 810 and 820 is approximately equal to 9 microvolts (µV).

Figure 9:
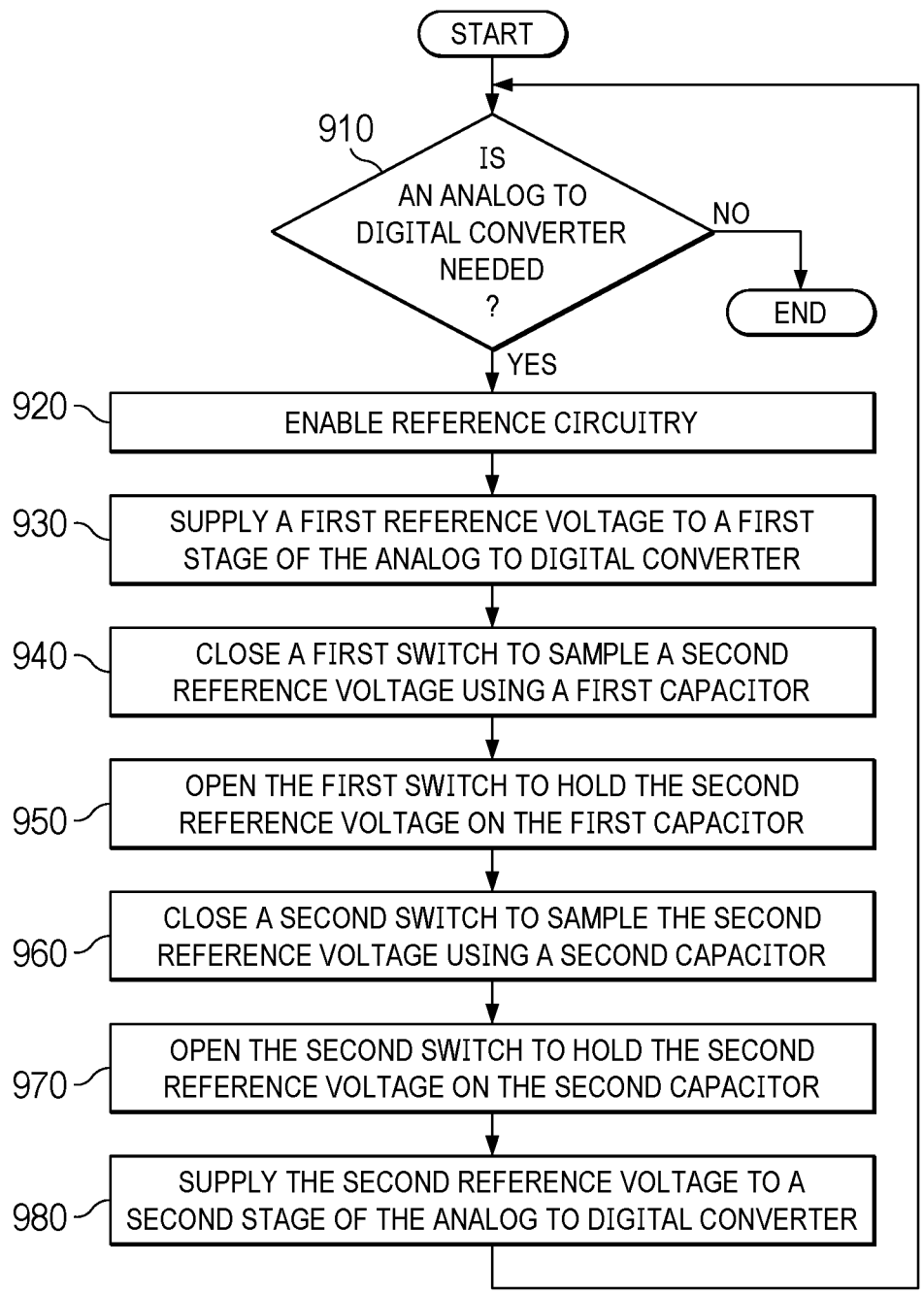
FIG. 9 is a flowchart representative of an example method that may be performed using hardware circuitry and/or machine readable instructions that can be executed and/or hardware configured to implement the reference generation circuitry of FIGS. 1 and 2, and/or, more generally, the pipeline ADC of FIG. 1.

FIG. 9 is a flowchart representative of an example method that may be performed using machine readable instructions that can be executed and/or hardware configured to implement the reference generation circuitry 150 of FIGS. 1 and 2, and/or, more generally, the pipeline ADC 100 of FIG. 1. The method of FIG. 9 begins at block 910. At block 910, the controller 250 of FIG. 2 determines if an analog-to-digital conversion is needed. For example, the controller 250 determines if the pipeline ADC 100 is needed by an example microcontroller (not illustrated). The method proceeds to end if the controller 250 determines the pipeline ADC 100 is not needed. The method proceeds to block 920 if the controller 250 determines the pipeline ADC 100 is needed.

At block 920, the controller 250 enables the reference generation circuitry 150. For example, the controller 250 enables the reference generation circuitry 150 by closing the first switch 210 of FIG. 2 and enabling the current source 215 of FIG. 2. The first switch 210 couples the voltage source 205 of FIG. 2 to the first resistor 220 of FIG. 2 when the first switch 210 is closed. The current source 215 supplies a current based on Equation (1), above. The method proceeds to block 930.

At block 930, the reference generation circuitry 150 supplies a first reference voltage to a first-stage of the pipeline ADC 100. For example, the voltage source 205 of FIG. 2 supplies the high voltage reference to the M-DAC 140. The method proceeds to block 940.

At block 940, the controller 250 closes a first switch to sample a second reference voltage using a first capacitor. For example, the controller 250 closes the second switch 230 of FIG. 2 to sample a reference voltage generated by the resistors 220 and 225 of FIG. 2 by coupling the reference voltage to the first capacitor 235. In such an example, the controller 250 may turn off the transistors 310 and 330 of FIG. 3 and turn on the second transistor 320 to close the second switch 230. Block 940 corresponds to the third time 770 of FIG. 7. The method proceeds to block 950.

At block 950, the controller 250 opens the first switch to hold the second reference voltage on the first capacitor. For example, the controller 250 opens the second switch 230 to hold the reference voltage across the first capacitor 235. In such an example, the controller 250 may turn on the transistors 310 and 330 and turn off the second transistor 320 to open the second switch 230. The method proceeds to block 960.

At block 960, the controller 250 closes a second switch to sample the second reference voltage using a second capacitor. For example, the controller 250 closes the third switch 240 of FIG. 2 to sample the small capacitor reference across the first capacitor 235 using the second capacitor 245. The method proceeds to block 970.

At block 970, the controller 250 opens the second switch to hold the second reference voltage on the second capacitor. For example, the controller 250 opens the third switch 240 to hold the large capacitor reference across the second capacitor 245. Inputs of the reference amplifiers 255 and 260 of FIG. 2 remain at a settled state following block 970. The method proceeds to block 980.

At block 980, the reference amplifier 255 and/or 260 supplies the second reference voltage to a second stage of the pipeline ADC 100. For example, the reference amplifiers 255 and 260 generate the first and second low voltage references based on the large capacitor reference being held on the second capacitor 245 following block 970. The method proceeds to block 910 to determine if the pipeline ADC 100 is still needed.

Figure 10:
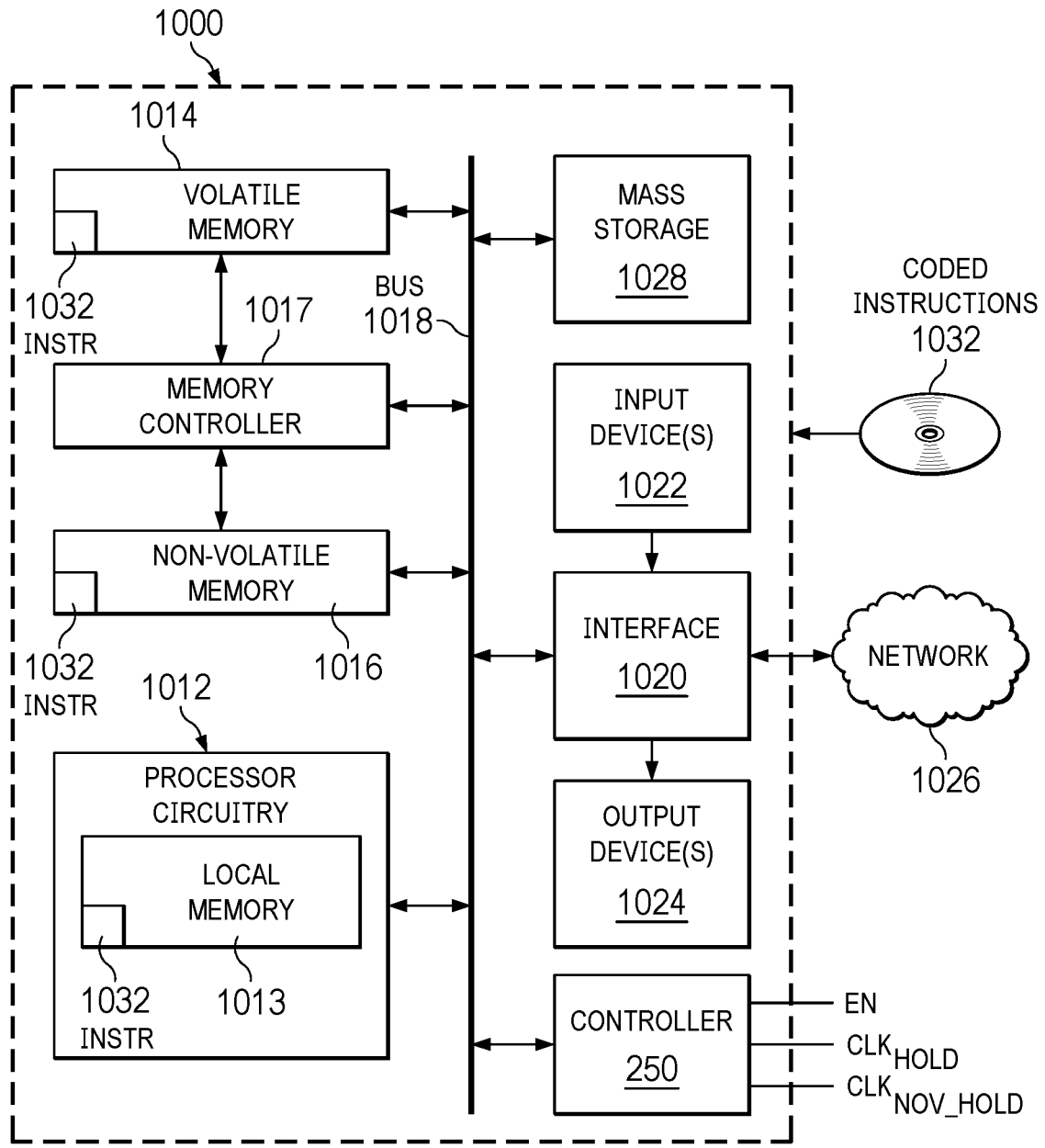
FIG. 10 is a block diagram of an example processing platform including processor circuitry structured to execute the example machine readable instructions and/or the example operations of FIG. 9 to implement the reference generation circuitry of FIGS. 1 and 2.

FIG. 10 is a block diagram of an example processor platform 1000 structured to execute and/or instantiate the machine readable instructions and/or the operations of FIG. 9 to implement the pipeline ADC 100 of FIG. 100. The processor platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 1000 of the illustrated example includes processor circuitry 1012. The processor circuitry 1012 of the illustrated example is hardware. For example, the processor circuitry 1012 can be implemented by one or more integrated circuits, logic circuits, FPGAs, microprocessors, CPUs, GPUs, DSPs, and/or microcontrollers from any desired family or manufacturer. The processor circuitry 1012 may be implemented by one or more semiconductor based (e.g., silicon based) devices. In this example, the processor circuitry 1012 may implement the controller 250 of FIG. 2.

The processor circuitry 1012 of the illustrated example includes a local memory 1013 (e.g., a cache, registers, etc.). The processor circuitry 1012 of the illustrated example is in communication with a main memory including a volatile memory 1014 and a non-volatile memory 1016 by a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1016 may be implemented by flash memory and/or any other desired type of memory device. Access to the main memory 1014, 1016 of the illustrated example is controlled by a memory controller 1017. Alternatively, the controller 250 may be implemented using circuitry coupled to the bus 1018.

The processor platform 1000 of the illustrated example also includes interface circuitry 1020. The interface circuitry 1020 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1022 are connected to the interface circuitry 1020. The input device(s) 1022 permit(s) a user to enter data and/or commands into the processor circuitry 1012. The input device(s) 1022 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1024 are also connected to the interface circuitry 1020 of the illustrated example. The output device(s) 1024 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1020 of the illustrated example, thus, typically includes a graphics driver card, a graphics driver chip, and/or graphics processor circuitry such as a GPU.

The interface circuitry 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1026. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1000 of the illustrated example also includes one or more mass storage devices 1028 to store software and/or data. Examples of such mass storage devices 1028 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 1032, which may be implemented by the machine readable instructions of FIG. 9, may be stored in the mass storage device 1028, in the volatile memory 1014, in the non-volatile memory 1016, and/or on a removable non-transitory computer readable storage medium such as a CD or DVD.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. An circuit comprising:
    sample and hold circuitry having an output;
    a first ADC having first and second inputs and an output, the first input of the first ADC coupled to the output of the sample and hold circuitry;
    a multiplying digital-to-analog converter (M-DAC) having first and second inputs and an output, the first input of the M-DAC coupled to the output of the first ADC;
    summation circuitry having first and second inputs and an output, the first input of the summation circuitry coupled to the output of the sample and hold circuitry, and the second input of the summation circuitry coupled to the output of the M-DAC;
    a second ADC having first and second inputs, the first input of the second ADC coupled to the output of the summation circuitry; and
    reference generation circuitry having a first output coupled to the second input of the first ADC, a second output coupled to the second input of the M-DAC, and a third output coupled to the second input of the second ADC, the reference generation circuitry including:
        reference voltage circuitry coupled to the second output; and
        voltage divider circuitry having an input coupled to the reference voltage circuitry and having an output coupled to the first and third outputs of the reference generation circuitry.

2. The circuit of claim 1, wherein the reference voltage circuitry is configured to generate a first voltage, and voltage divider circuitry is configured to generate a second voltage less than the first voltage.

3. The circuit of claim 1, wherein the reference generation circuitry includes:
    a switch having a first terminal coupled to the output of the voltage divider circuitry and having a second terminal; and
    a capacitor having a terminal coupled to the second terminal of the switch and coupled to the first and third outputs of the reference generation circuitry.

4. The circuit of claim 3, wherein the reference generation circuitry further includes amplifier circuitry having an input to the terminal of the capacitor, having a first output coupled to the second input of the first ADC and having a second output coupled to the second input of the second ADC.

5. The circuit of claim 4, wherein the amplifier circuitry includes:
    a first amplifier having an input coupled to the terminal of the capacitor and having an output coupled to the second input of the first ADC; and
    a second amplifier having an input coupled to the terminal of the capacitor and having an output coupled to the second input of the second ADC.

6. The circuit of claim 3, wherein the switch is a first switch, the capacitor is a first capacitor, and the reference generation circuit includes:
    a second switch having a first terminal coupled to the terminal of the first capacitor, and having a second terminal; and
    a second capacitor having a terminal coupled to the second terminal of the second switch and to the first and third outputs of the reference generation circuitry.

7. The circuit of claim 6, further comprising a controller coupled to the first switch and the second switch, the controller configured to:
    close the first switch to set a first voltage across the first capacitor;
    open the first switch to hold the first voltage across the first capacitor; and
    close the second switch to set a second voltage across the second capacitor approximately equal to the first voltage of the first capacitor.

8. The circuit of claim 3, wherein the voltage divider circuitry includes:
    a first resistor having a first terminal coupled to the reference voltage circuitry, and having a second terminal; and
    a second resistor having a terminal coupled the second terminal of the first resistor and to the first terminal of the switch.

9. The circuit of claim 3, further comprising an amplifier coupling the output of the summation circuitry to the input of the second ADC.

10. The circuit of claim 1, wherein the summation circuitry is configured as subtractor circuitry.

11. The circuit_of claim 1, wherein the first ADC is configured to provide a most significant bit of a digital word at an output of the first ADC, and the second sub-ADC is configured to provide_least significant bits of the digital word at an output of the second ADC.

12. A device comprising:
    an (ADC) including:
    a first sub-ADC having a reference input and an output;
    a second sub-ADC having a reference input and a second input;
    a multiplying digital-to-analog converter (M-DAC) having a reference input, having a second input coupled to the output of the first sub-ADC, and having an output coupled to the second input of the second sub-ADC; and
    reference generation circuitry including:
        a first resistor having a first terminal coupled to the reference input of the M-DAC, and having a second terminal;
        a second resistor having a terminal coupled to the second terminal of the first resistor;
        a first switch having a first terminal coupled to the second terminal of the first resistor and to the terminal of the second resistor, and having a second terminal;
        a first capacitor having a terminal coupled the second terminal of the first switch;
        a second switch having a first terminal coupled to the terminal of the first capacitor, and having a second terminal;
        a second capacitor having a terminal coupled to the second terminal of the second switch; and amplifier circuitry having an input coupled to the terminal of the second capacitor, having a first output coupled to the reference input of the first sub-ADC, and having a second output coupled to the reference input of the second sub-ADC.

13. The device of claim 12, wherein the first switch includes:
- a first transistor coupled to the first resistor and the second resistor;
- a second transistor coupled to the first resistor, the second resistor, the second switch, the first capacitor, and the first transistor; and
- a third transistor coupled to the second transistor, the second switch, and the first capacitor.

14. The device of claim 12, wherein the amplifier circuitry includes:
- a first amplifier having an input coupled to the terminal of the second capacitor and having an output coupled to the reference input of the first sub-ADC; and
- a second amplifier having an input coupled to the terminal of the second capacitor and having an output coupled to the reference input of the second sub-ADC.

15. The device of claim 12, wherein the reference generation circuitry further includes a controller coupled to the first switch and the second switch, the controller configured to:
- close the first switch to set a voltage of the first capacitor equal to a reference voltage;
- open the first switch to hold the reference voltage on the first capacitor; and
- close the second switch to set a voltage of the second capacitor equal to the reference voltage on the first capacitor.

16. The device of claim 12, wherein the reference generation circuitry further includes:
- a transistor coupled between a voltage source terminal and the first resistor, the transistor configured to enable the reference generation circuitry; and
- a current source coupled to the transistor and the first resistor, the current source configured to supply a current to set a voltage drop across the first resistor and the second resistor equal to a voltage generated by the voltage source.

17. The device of claim 12, wherein the second capacitor has a first capacitance greater than a second capacitance of the first capacitor.

18. The device of claim 12, wherein the amplifier circuitry includes trim circuitry configured to compensate a voltage across the second capacitor for direct current (DC) offset and temperature variation.

19. A method of operating an analog-to-digital converter (ADC), the method comprising:
- supplying, by reference voltage generation circuitry, a first reference voltage to a multiplying digital-to-analog converter of the ADC;
- closing, by a controller, a first switch to supply a second reference voltage to a first capacitor, the second reference voltage generated using the first reference voltage;
- opening, by the controller, the first switch to hold the second reference voltage on the first capacitor;
- closing, by the controller, a second switch to supply the second reference voltage to a second capacitor;
- opening, by the controller, the second switch to hold the second reference voltage on the second capacitor; and
- supplying, by an amplifier, the second reference voltage to a sub-ADC.

20. The method of claim 19, wherein the amplifier is a first amplifier, and the sub-ADC is a first sub-ADC, further including supplying, by a second amplifier, the second reference voltage to a second sub-ADC.

21. The method of claim 19, further including averaging, by the second capacitor, the second reference voltage.

22. The method of claim 19, further including reducing noise on the second reference voltage and coupling between the second capacitor and the amplifier by having a larger capacitance of the second capacitor relative to a capacitance of the first capacitor.

23. The method of claim 19, wherein the second reference voltage is sampled by the first switch prior to the second switch sampling the first capacitor.

24. The method of claim 19, wherein opening the first switch is in response to supplying a potential to a transistor by a dedicated reference source.

* * * * *